(12) United States Patent
Hu et al.

(10) Patent No.: US 11,676,908 B2
(45) Date of Patent: Jun. 13, 2023

(54) SYSTEM AND METHOD FOR ALIGNED STITCHING

(71) Applicant: Taiwan Semiconductor Manufacturing Company, Ltd., Hsinchu (TW)

(72) Inventors: Chih-Chia Hu, Taipei (TW); Chang-Ching Yu, Hsinchu (TW); Ming-Fa Chen, Taichung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 67 days.

(21) Appl. No.: 16/716,167

(22) Filed: Dec. 16, 2019

(65) Prior Publication Data

US 2020/0118937 A1    Apr. 16, 2020

Related U.S. Application Data

(62) Division of application No. 15/907,945, filed on Feb. 28, 2018, now Pat. No. 10,510,676.

(Continued)

(51) Int. Cl.
*H01L 23/544* (2006.01)
*H01L 21/56* (2006.01)
(Continued)

(52) U.S. Cl.
CPC .............. *H01L 23/544* (2013.01); *G03F 1/00* (2013.01); *G03F 1/42* (2013.01); *G03F 7/70475* (2013.01);
(Continued)

(58) Field of Classification Search
CPC .......... G03F 1/42; G03F 9/708; G03F 9/7084; G03F 7/70741; G03F 7/70633;
(Continued)

(56) References Cited

U.S. PATENT DOCUMENTS 5,017,514 A * 5/1991 Nishimoto ................ G03F 9/00
430/311
2011/0115057 A1 * 5/2011 Harn ...................... G03F 9/7084
257/E23.179

(Continued)

*Primary Examiner* — Nelson Garces
(74) *Attorney, Agent, or Firm* — Slater Matsil, LLP

(57) ABSTRACT

A method for manufacturing semiconductor devices include steps of depositing a first photoresist over a first dielectric layer, first exposing the first photoresist to a first light-exposure using a first lithographic mask, and second exposing the first photoresist to a second light-exposure using a second lithographic mask. An overlap region of the first photoresist is exposed to both the first light-exposure and the second light-exposure. The first dielectric layer is thereafter patterned to form a mask overlay alignment mark in the overlap region. The patterning includes etching the first dielectric layer form a trench, and filling the trench with a conductive material to produce the alignment mark. A second dielectric layer is deposited over the alignment mark, and a second photoresist is deposited over the second dielectric layer. A third lithographic mask is aligned to the second photoresist using the underlying mask overlay alignment mark for registration.

20 Claims, 34 Drawing Sheets

Related U.S. Application Data

(60) Provisional application No. 62/593,173, filed on Nov. 30, 2017.

(51) Int. Cl.
  *G03F 9/00* (2006.01)
  *G03F 7/00* (2006.01)
  *G03F 1/00* (2012.01)
  *G03F 1/42* (2012.01)
  *H01L 21/60* (2006.01)

(52) U.S. Cl.
  CPC .......... *G03F 7/70633* (2013.01); *G03F 9/708* (2013.01); *H01L 21/56* (2013.01); *H01L 21/60* (2021.08); *H01L 2223/54426* (2013.01)

(58) Field of Classification Search
  CPC ..... G03F 1/00; G03F 7/70475; H01L 23/544; H01L 21/56; H01L 21/682; H01L 2021/60; H01L 21/76816; H01L 21/76808; H01L 21/76898; H01L 2924/181; H01L 2924/15311; H01L 2224/16225; H01L 2223/54426
  See application file for complete search history.

(56) References Cited

U.S. PATENT DOCUMENTS

| | | | |
|---|---|---|---|
| 2013/0015587 A1* | 1/2013 | Okutsu | H01L 23/522 257/774 |
| 2016/0109794 A1* | 4/2016 | Jang | G03F 7/22 430/311 |
| 2017/0213798 A1* | 7/2017 | Wei | H01L 23/564 |
| 2018/0330999 A1* | 11/2018 | Lee | G03F 9/7019 |
| 2020/0066651 A1* | 2/2020 | Burton | G03F 7/70741 |

* cited by examiner

US 11,676,908 B2

SYSTEM AND METHOD FOR ALIGNED STITCHING

PRIORITY CLAIM AND CROSS-REFERENCE

This application is a division of U.S. application Ser. No. 15/907,945, filed on Feb. 28, 2018, entitled "System and Method for Aligned Stitching," which application claims priority to and the benefit of U.S. Provisional Application No. 62/593,173, filed on Nov. 30, 2017, entitled "System and Method for Aligned Stitching," which applications are hereby incorporated herein by reference in their entirety.

BACKGROUND

In the packaging of integrated circuits, a plurality of device dies may be bonded on an interposer wafer, which may include a plurality of interposers disposed therein. After bonding the device dies, an underfill is dispensed to fill gaps between the device dies and the interposer wafer. A curing process may then be performed to cure the underfill. A molding compound can be applied to encapsulate the device dies. The resulting interposer wafer and top dies may then be sawed apart into a plurality of packages, with the packages including exposed electrical connectors (e.g., solder balls). The packages are then bonded to package substrates or printed circuit boards.

BRIEF DESCRIPTION OF THE DRAWINGS

Aspects of the present disclosure are best understood from the following detailed description, when read in conjunction with the accompanying Figures. It is noted that, in accordance with standard practice in the industry, various features may not be drawn to scale. Dimensions of various features representatively illustrated herein may be arbitrarily increased or reduced for clarity of illustration or description.

DETAILED DESCRIPTION

Figure 1:
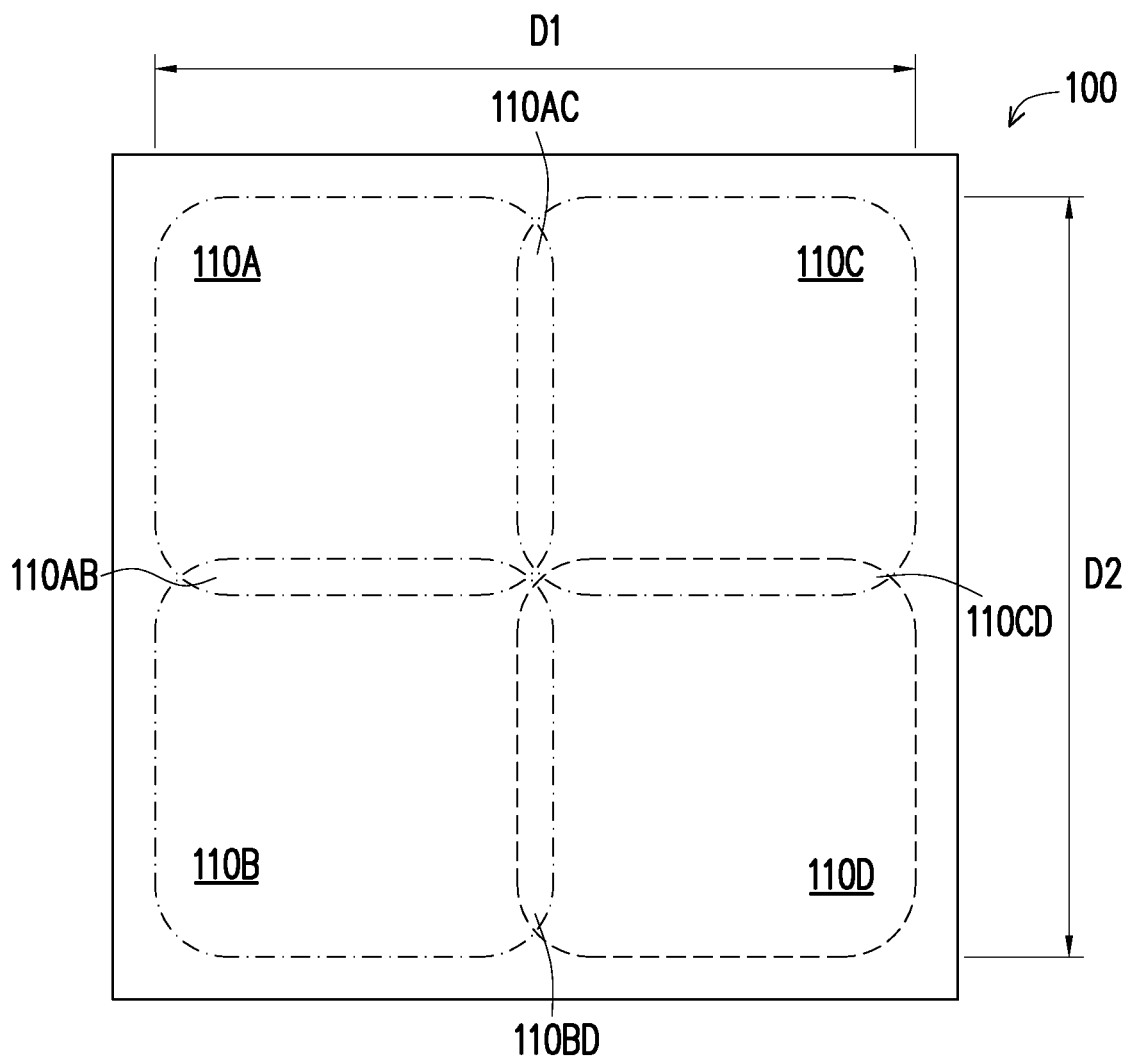
FIGS. 1 through 28 representatively illustrate cross-sectional views and schematic top views of intermediate stages in formation of a semiconductor device using overlay stitching, in accordance with some embodiments.

The following disclosure provides different embodiments, or examples, for implementing different features. Specific examples of components and arrangements are described below to simplify the present disclosure. These are, of course, merely examples and are not intended to be limiting. For example, formation of a first feature over or on a second feature in the description that follows may include embodiments in which the first and second features are formed in direct contact, and may also include embodiments in which additional features may be formed between the first and second features, such that the first and second features may not be in direct contact. Additionally, the present disclosure may repeat reference numerals or letters in various examples. This repetition is for the purpose of simplicity and clarity, and does not in itself indicate a relationship between various embodiments or configurations discussed herein.

Further, spatially relative terms, such as "underlying," "below," "lower," "bottom," "overlying," "upper," "above," "top," or the like, may be used herein for ease of description to describe one element or feature in relation to another element or feature as illustrated in the Figures. Spatially relative terms are intended to encompass different orientations of a device in use or operation, in addition to orientations representatively illustrated, for example, in the Figures. Devices may be otherwise oriented (e.g., rotated 90 degrees or at other orientations), and spatially relative descriptors used herein may likewise be interpreted accordingly.

A large chip in a wafer and a method of forming same using mask overlay stitching are provided in accordance with various representative embodiments. Intermediate stages of forming a chip are illustrated. Variations of some embodiments are discussed. Throughout various views and illustrative embodiments, like reference numbers are used herein to designate like elements.

FIGS. 1 through 28 representatively illustrate cross-sectional views and schematic top views of intermediate stages in formation of a large chip, in accordance with some embodiments. Steps shown in FIGS. 1 through 28 are also shown schematically in process flows, as representatively illustrated in FIGS. 30 through 33. Manufacturing steps shown in FIGS. 1 through 28 are discussed with reference to process steps in FIGS. 30 through 33.

FIG. 1 representatively schematically illustrates a top view of a large semiconductor die 100 in accordance with some embodiments. Semiconductor die 100 may include active device structures (e.g., transistors, diodes, or the like). In other embodiments, semiconductor die 100 may be an interposer configured to provide signal routing for externally mounted active devices. Semiconductor die 100 includes first active signal region 110A, second active signal region 110B, third active signal region 110C, and fourth active signal region 110D. First overlap region 110AB is disposed between first active signal region 110A and second active signal region 110B, and includes overlapping portions of first active signal region 110A and second active signal region 110B. Second overlap region 110AC is disposed between first active signal region 110A and third active signal region 110C, and includes overlapping portions of first active signal region 110A and third active signal region 110C. Third overlap region 110CD is disposed between third active signal region 110C and fourth active signal region 110D, and includes overlapping portions of third active signal region 110C and fourth active signal region 110D. Fourth overlap region 110BD is disposed between second active signal region 110B and fourth active signal region 110D, and includes overlapping portions of second active signal region 110B and fourth active signal region 110D.

Figure 2:
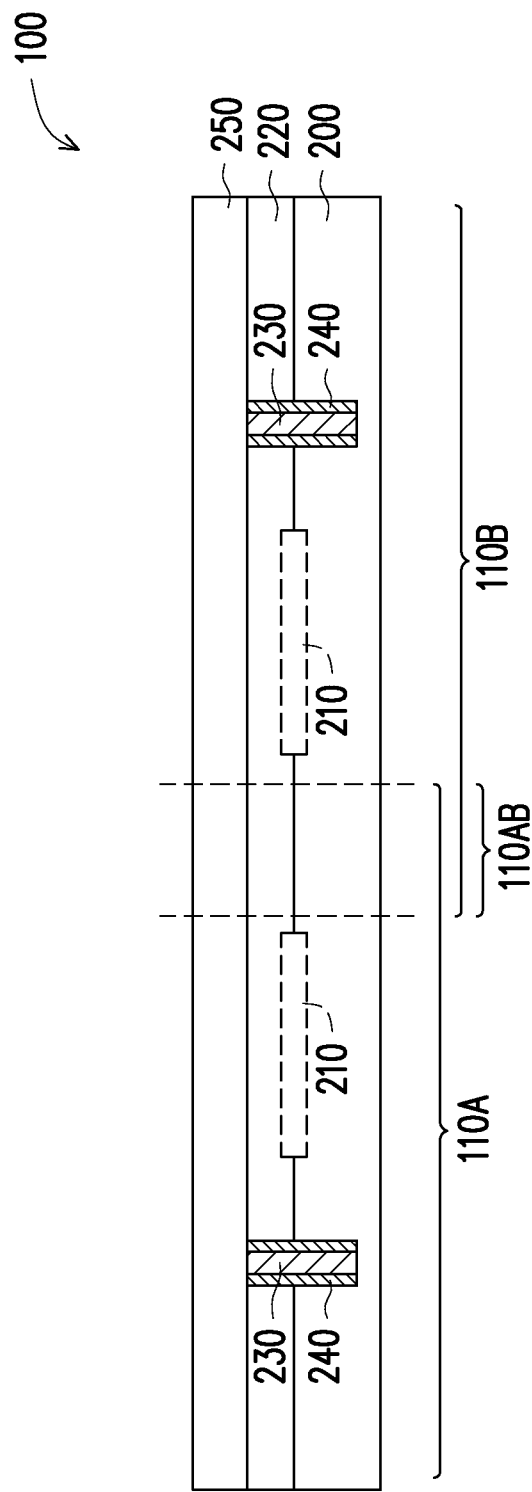

FIG. 2 representatively illustrates a cross-sectional view of semiconductor die 100. In accordance with some embodiments of the present disclosure, semiconductor die 100 is a device wafer including integrated circuit devices 210, which are formed on a top surface of semiconductor substrate 200. Representative integrated circuit devices 210 include complementary metal-oxide semiconductor (CMOS) transistors, resistors, capacitors, diodes, or the like. Details of integrated circuit devices 210 are not illustrated herein. In accordance with alternative embodiments of the present disclosure, semiconductor die 100 is an interposer wafer, which does not include active devices such as transistors and diodes, and may or may not include passive devices. Interposer semiconductor die 100 may include a plurality of interposers having conductive features (e.g., metal pads) on opposite sides of interposers. Conductive traces and vias are formed in the interposers to electrically interconnect conductive features on opposite sides of the interposers.

In accordance with some embodiments of the present disclosure, semiconductor die 100 includes substrate 200. Substrate 200 may be a semiconductor substrate or a dielectric substrate. In the case of substrate 200 including a semiconductor substrate, substrate 200 may be formed of crystalline silicon, crystalline germanium, silicon germanium, or a III-V compound semiconductor, such as GaAsP, AlInAs, AlGaAs, GaInAs, GaInP, GaInAsP, or the like. Semiconductor substrate 200 may also be a bulk silicon substrate or a silicon-on-insulator (SOI) substrate. Shallow trench isolation (STI) regions (not illustrated) may be formed in semiconductor substrate 200 to isolate active regions in semiconductor substrate 200. In the case of substrate 200 including a dielectric substrate, substrate 200 may be formed of silicon oxide, silicon carbide, silicon nitride, or the like. Through-vias 230 may be formed to extend into semiconductor substrate 200, where through-vias 230 are used to electrically inter-couple features on opposite sides of semiconductor die boo. Through-vias 230 may be insulated from substrate 200 by isolation layers 240.

Semiconductor die 100 includes first active signal region 110A and second active signal region 110B, which may be alternatively regarded as a first reticle field region (110A) and a second reticle field region (110B), respectively. Regions 110A and 110B have an overlapping region 110AB, which may be referred to as a stitching zone—since metal features that extend from region 110A to region 110B are stitched together (or joined) in region 110AB. In an embodiment, stitching zone 110AB is a strip, which may have a uniform width. Additionally, regions 110A and 110B may have a substantially same size; although in other embodiments, their size or shape may be different from each other.

Semiconductor die 100 includes third active signal region 110C, which may be alternatively regarded as a third reticle field region (110C). Regions 110A and 110C have an overlapping region 110AC, which is also a stitching zone—since metal features that extend from region 110A to region 110C are stitched in region 110AC. In an embodiment, stitching zone 110AC is a strip, which may have a uniform width. Additionally, regions 110A and 110C may have a substantially same size; although in other embodiments, their sizes may be different from each other.

Semiconductor die 100 includes fourth active signal region 110D, which may be alternatively regarded as a fourth reticle field region (110D). Regions 110C and 110D have an overlapping region 110CD, which is also a stitching zone—since metal features that extend from region 110C to region 110D are stitched in region 110CD. In an embodiment, stitching zone 110CD is a strip, which may have a uniform width. Additionally, regions 110C and 110D may have a substantially same size; although in other embodiments, their sizes may be different from each other.

In some embodiments, semiconductor die 100 may have a combined length $D_1$ across first reticle field region 110A and third reticle field region 110C of more than about 26 mm. In other embodiments, semiconductor die 100 may have a combined length $D_1$ across first reticle field region 110A and third reticle field region 110C of more than about 33 mm. In some embodiments, semiconductor die 100 may have a combined length $D_2$ across first reticle field region 110A and second reticle field region 110B of more than about 26 mm. In some embodiments, semiconductor die 100 may have a combined length $D_2$ across first reticle field region 110A and second reticle field region 110B of more than about 33 mm. In some embodiments $D_1$ may be greater than about 33 mm and $D_2$ may be greater than about 26 mm.

Regions 110B and 110D have an overlapping region 110BD, which is also a stitching zone—since metal features that extend from region 110B to region 110D are stitched together in region 110BD. In an embodiment, stitching zone 110BD is a strip, which may have a uniform width. Additionally, regions 110B and 110D may have a substantially same size or shape; although in other embodiments, their sizes and shapes may be different from each other.

Semiconductor die 100 may include a plurality of groupings of regions substantially identical to the grouping of regions 110A, 110B, 110C, and 110D, where the plurality of groupings of regions may form an array of dies. Each grouping of regions 110A, 110B, 110C, and 110D is used to provide a large chip area in a single die.

Inter-layer dielectric (ILD) 220 is formed over semiconductor substrate 200 and fills spaces between the gate stacks of transistors (not illustrated) in integrated circuit devices 210 (if any). In accordance with some representative embodiments, ILD 220 comprises phosphosilicate glass (PSG), borosilicate glass (BSG), boron-doped phosphosilicate glass (BPSG), fluorine-doped silicate glass (FSG), tetraethyl orthosilicate (TEOS), or the like. ILD 220 may be formed using spin coating, flowable chemical vapor deposition (FCVD), or the like. In accordance with some embodiments of the present disclosure, ILD 220 is formed using a deposition method such as plasma enhanced chemical vapor deposition (PECVD), low pressure chemical vapor deposition (LPCVD), or the like. Through-vias 230 may also extend into ILD 220 in accordance with some embodiments.

An etch stop layer (not illustrated) may be formed over and in contact with ILD 220 and integrated circuit devices 210, if any. The etch stop layer may be formed of silicon carbide, silicon nitride, silicon oxynitride, silicon carbonitride, or the like. The etch stop layer is formed of a material that has a high etching selectivity relative to the overlying dielectric layer 250, and hence the etch stop layer may be used to stop the etching of dielectric layer 250.

In accordance with some embodiments in which semiconductor die 100 is an interposer wafer, integrated circuit devices 210 and ILD 220 may not be formed.

Dielectric layer 250 is further illustrated in FIG. 2, which is alternatively referred to as an inter-metal dielectric (IMD) layer (250) hereinafter. In accordance with some embodiments of the present disclosure, IMD layer 250 is formed of a low-k dielectric material having a dielectric constant (k-value) lower than about 3.0, lower than about 2.5, or even lower. IMD layer 250 may be formed of BLACK DIAMOND (a registered trademark of Applied Materials, Santa Clara, Calif., USA), a carbon-containing low-k dielectric material, hydrogen silsesquioxane (HSQ), methylsilsesquioxane (MSQ), or the like. In accordance with some embodiments of the present disclosure, the formation of IMD layer 250 includes depositing a porogen-containing dielectric material, and then performing a curing process to drive out the porogen, rendering the remaining IMD layer 250 porous.

In accordance with some embodiments, IMD layer 250 is formed of a non-low-k dielectric material such as silicon oxide, silicon nitride, silicon carbide, silicon oxynitride, or the like.

Figure 3:
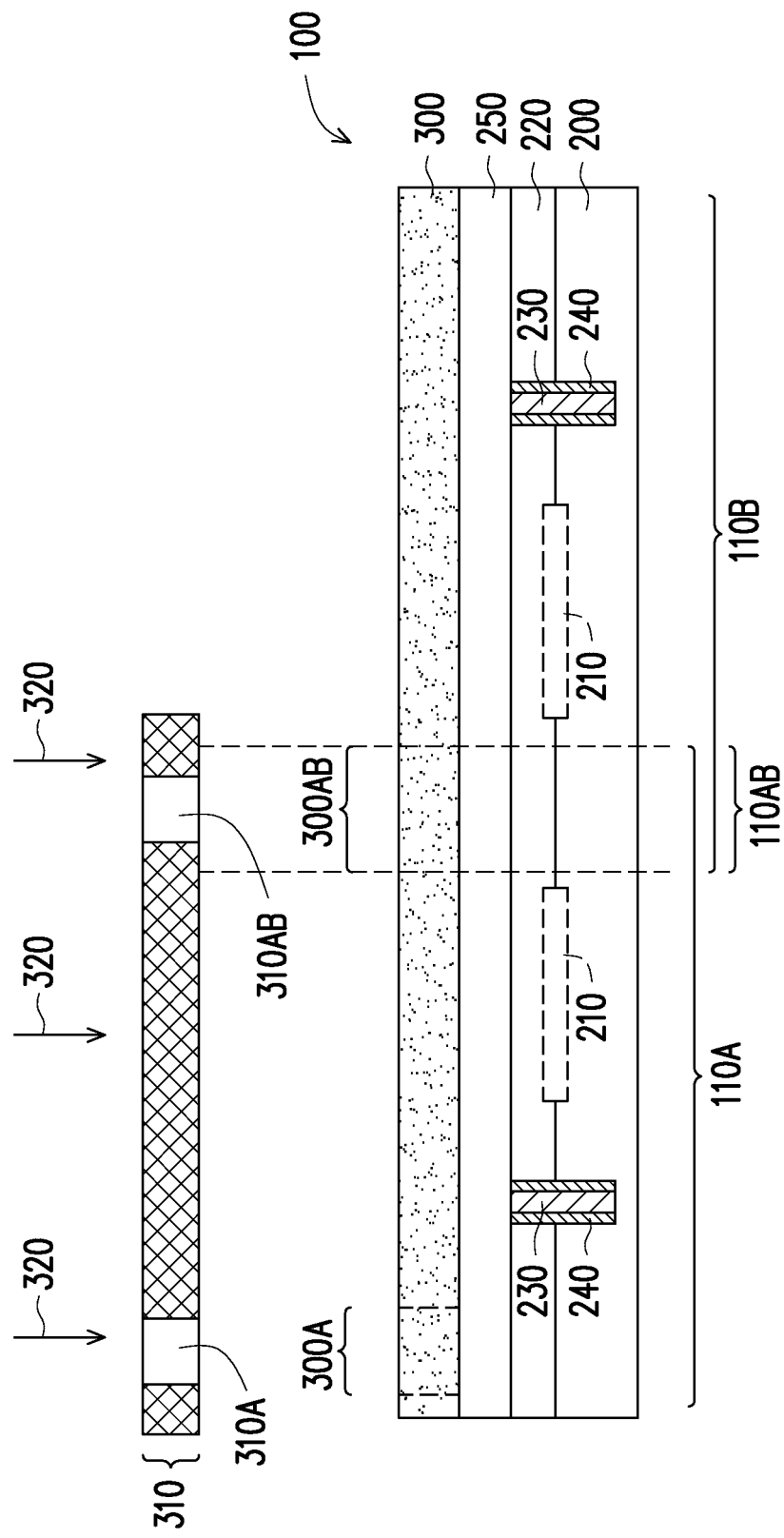

FIGS. 3 through 13 representatively illustrate a single damascene process. Referring to FIG. 3, photoresist 300 is applied over IMD layer 250. The respective step is shown as step 3110 in the process flow illustrated in FIG. 31, step 3210 in the process flow illustrated in FIG. 32, and step 3305 in the process flow illustrated in FIG. 33. FIG. 3 is a cross-section (see A-A cross-section of FIG. 5) representatively illustrating a portion of a first light-exposure 320 through a first lithography mask 310. First lithography mask 310 is placed so as to expose (e.g., directly over) first active signal region 110A (including stitching zone 110AB). First lithography mask 310, limited by the maximum size of its reticle field, is not large enough to cover both first active signal region 110A and second active signal region 110B. Rather, first lithography mask 310 is used to expose portions of photoresist 300 in first active signal region 110A and first overlay stitching zone 110AB, but not second active signal region 110B. First light-exposure 320 is performed to expose photoresist portion 300A through mask opening 310A, and photoresist portion 300AB through mask opening 310AB, with remaining portions of photoresist 300 in the view of FIG. 3 not being exposed. The respective step is shown as step 3120 in the process flow illustrated in FIG. 31, step 3220 in the process flow illustrated in FIG. 32, and step 3310 in the process flow illustrated in FIG. 33.

Figure 4:
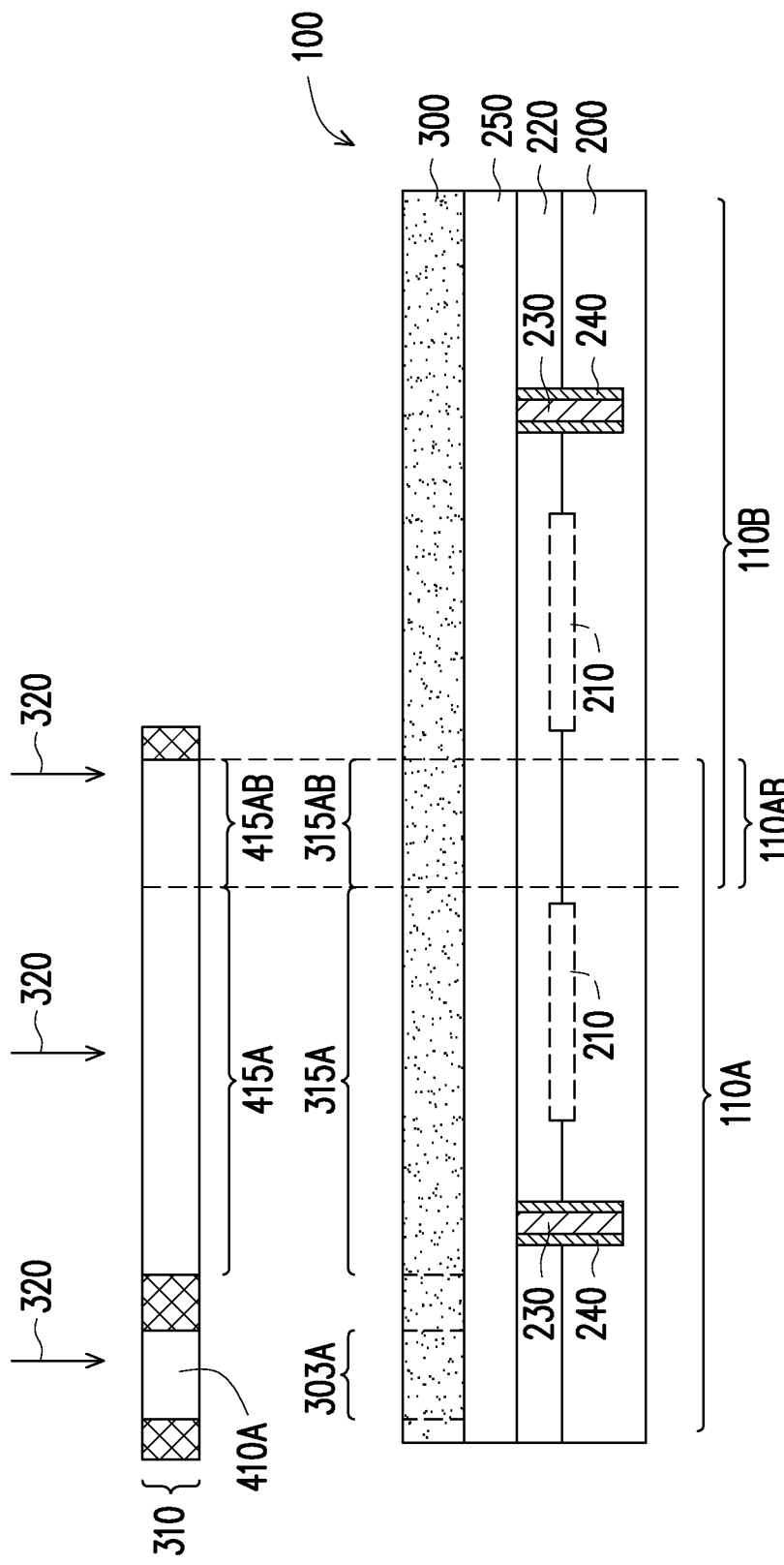

FIG. 4 is another cross-section (B-B cross-section of FIG. 5) representatively illustrating another portion of first light-exposure 320 through first lithography mask 310. Concurrent with first light-exposure 320, photoresist portion 303A is exposed through mask opening 410A, photoresist portion 315A is exposed through mask opening portion 415A, and photoresist portion 315AB is exposed through mask opening portion 415AB, with remaining portions of photoresist 300 in the view of FIG. 4 not being exposed. Again, the respective step is shown as step 3120 in the process flow illustrated in FIG. 31, step 3220 in the process flow illustrated in FIG. 32, and step 3310 in the process flow illustrated in FIG. 33.

Figure 5:
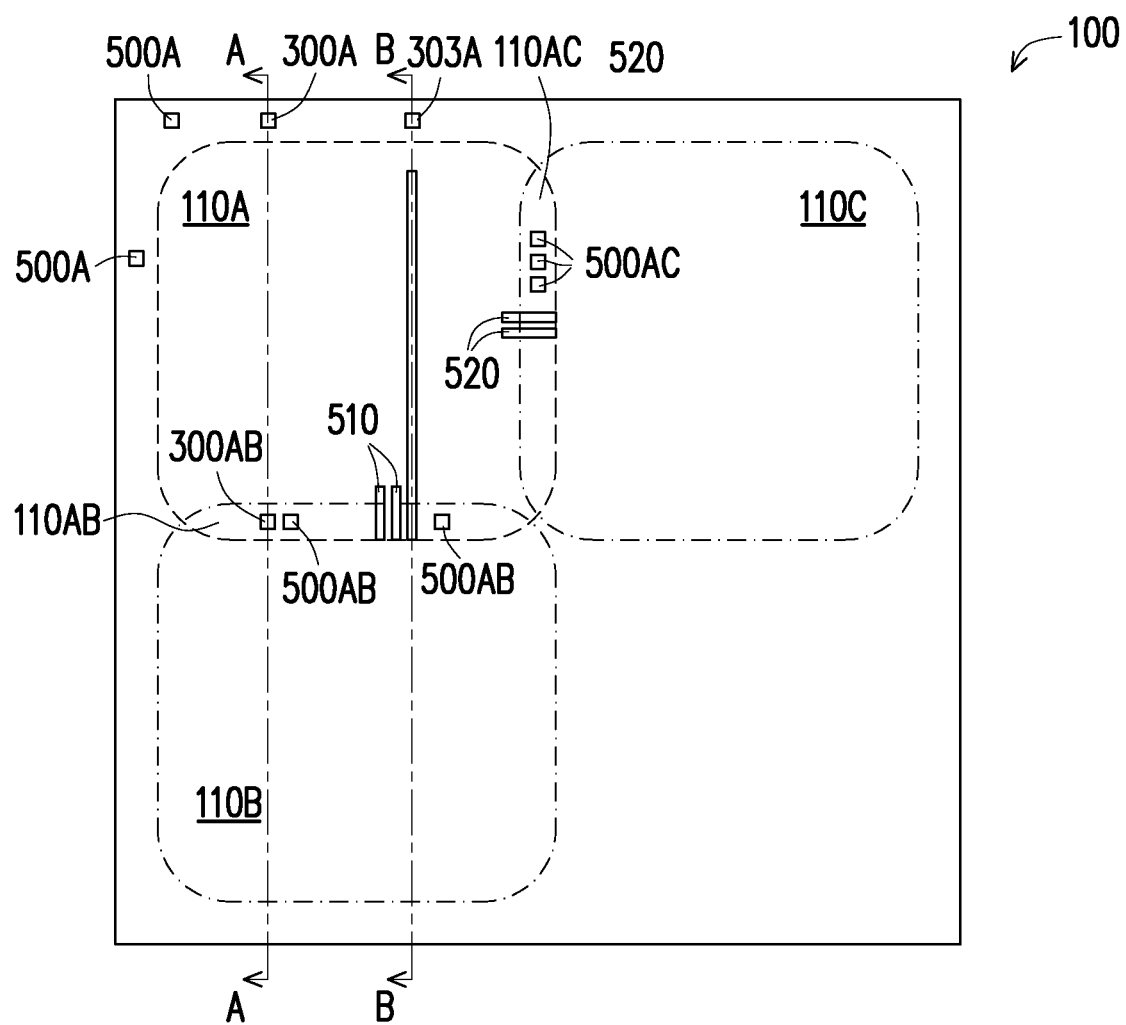

FIG. 5 illustrates a schematic top view of photoresist 300 after the first light-exposure 320, as shown in FIGS. 3 and 4. Some exposed regions are illustrated schematically, where the exposed regions of FIG. 5 are in or near first active signal region 110A. Exposed portions include portions 300A, 500A, 303A, 300AB, 500AB, and 500AC, which correspond to exposed areas that will provide, after further processing, a first set of mask overlay alignment marks (indicated in the schematic illustration of FIG. 5 as squares). Exposed portions 300A, 500A, and 303A are near peripheral edges of semiconductor die 100 in an L-shaped frame bordering first active signal region 110A. Exposed portions 300AB and 500AB are in first overlay stitching zone 110AB disposed between and interposing first active signal region 110A and second active signal region 110B. Exposed portions 500AC are in second overlay stitching zone 110AC disposed between and interposing first active signal region 110A and third active signal region 110C. Exposed portions 510 and 315 correspond to exposed areas that will provide, after further processing in subsequent steps, a set of active signal lines between first active signal region 110A and second active signal region 110B. Exposed portions 520 correspond to exposed areas that will provide, after further processing in subsequent steps, a set of active signal lines between first active signal region 110A and third active signal region 110C.

Figure 6:
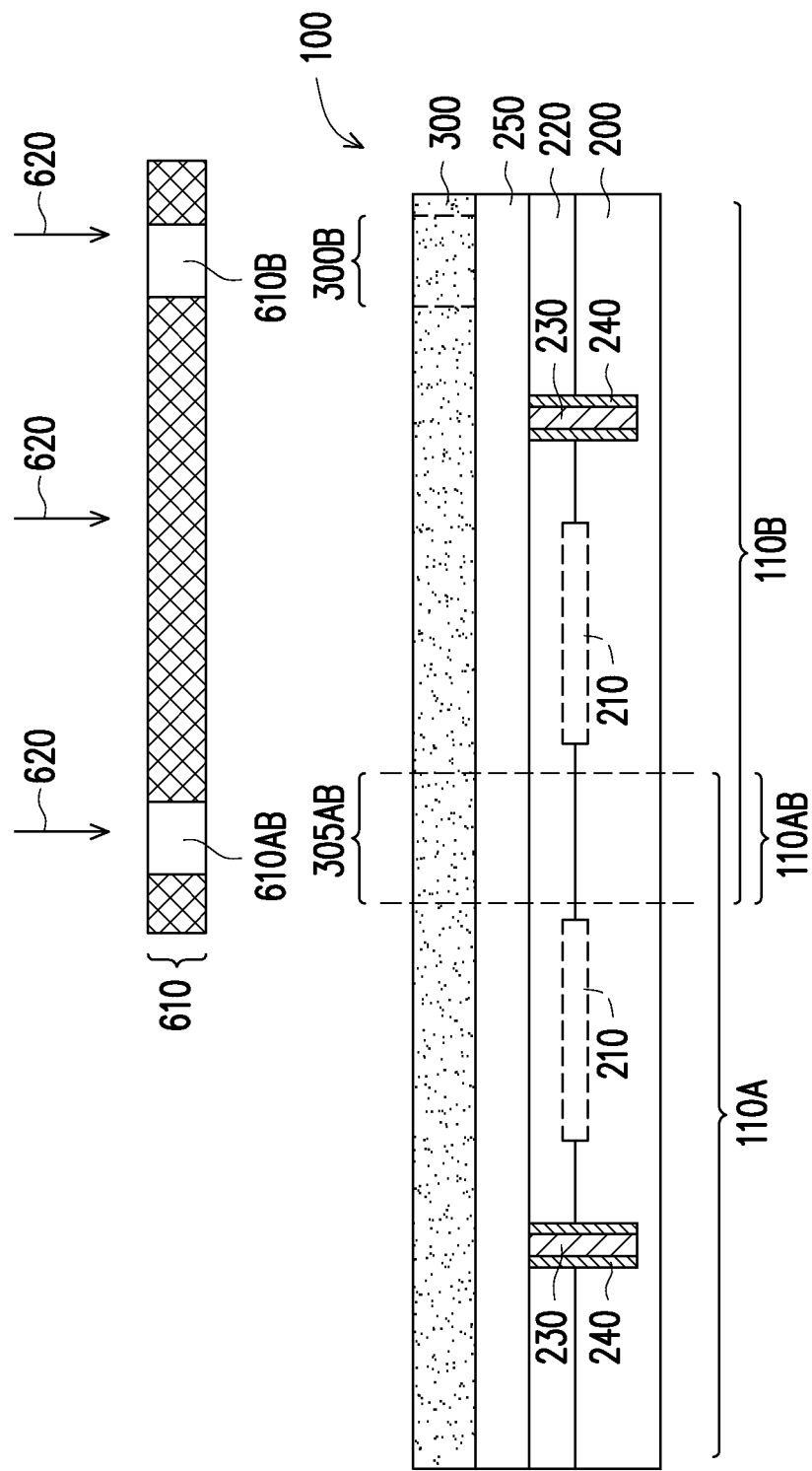
Figure 8:
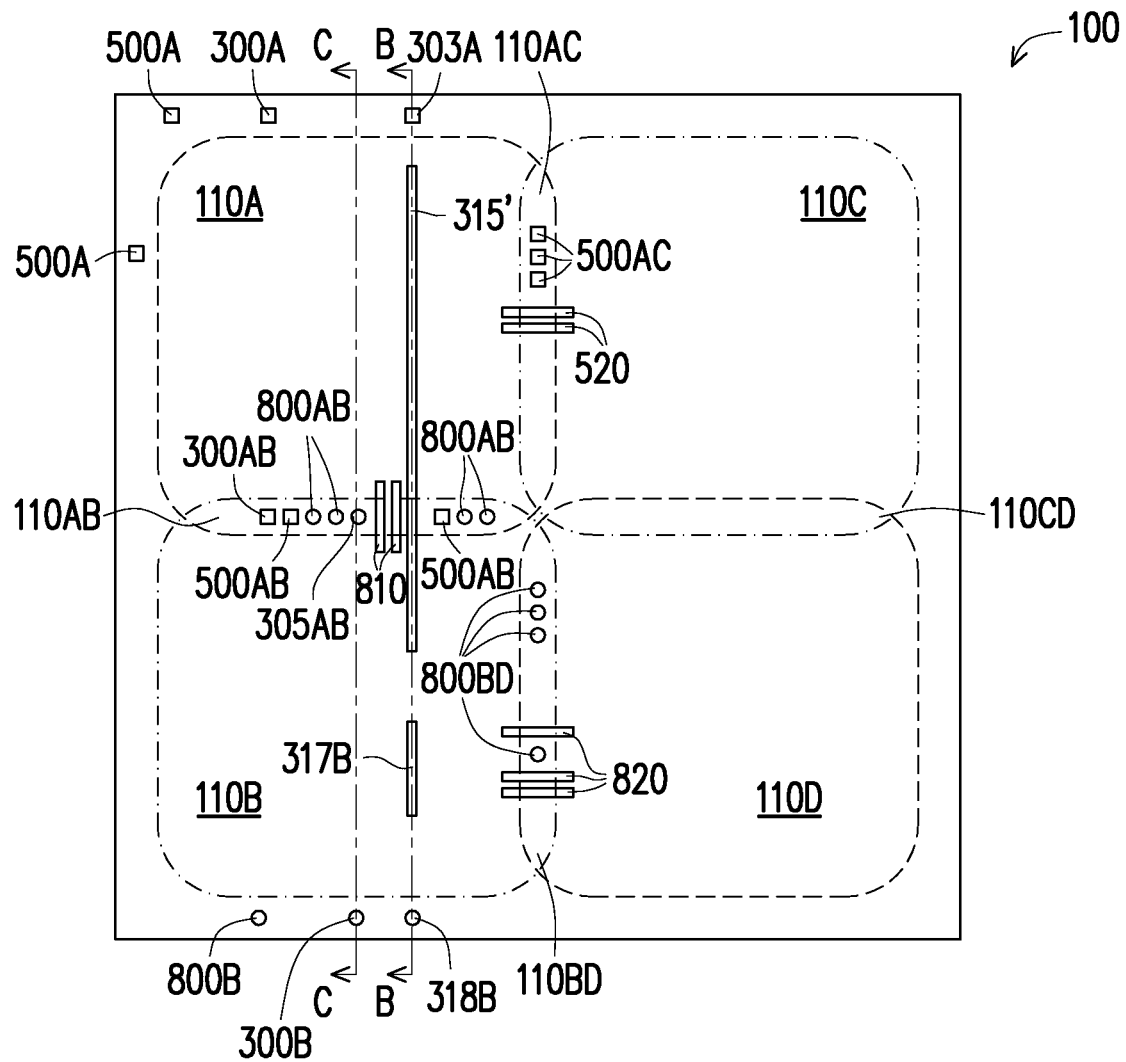

FIG. 6 is taken along the C-C cross-section shown in the schematic top view of exposed portions of photoresist 300 shown in FIG. 8. FIG. 6 representatively illustrates a portion of a second light-exposure 620 through a second lithography mask 610. Second lithography mask 610 is placed so as to expose (e.g., directly over) second active signal region 110B (including stitching zone 110AB). Second lithography mask 610, limited by the maximum size of its reticle field, is not large enough to cover both second active signal region 110B and first active signal region 110A. Rather, second lithography mask 610 is used to expose portions of photoresist 300 in second active signal region 110B and first overlay stitching zone 110AB, but not first active signal region 110A. Second light-exposure 620 is then performed to expose photoresist portion 300B through mask opening 610B, and photoresist portion 305AB through mask opening 610AB, with remaining portions of photoresist 300 in the view of FIG. 6 not being exposed. The respective step is shown as step 3130 in the process flow illustrated in FIG. 31, step 3230 in the process flow illustrated in FIG. 32, and step 3315 in the process flow illustrated in FIG. 33.

Figure 7:
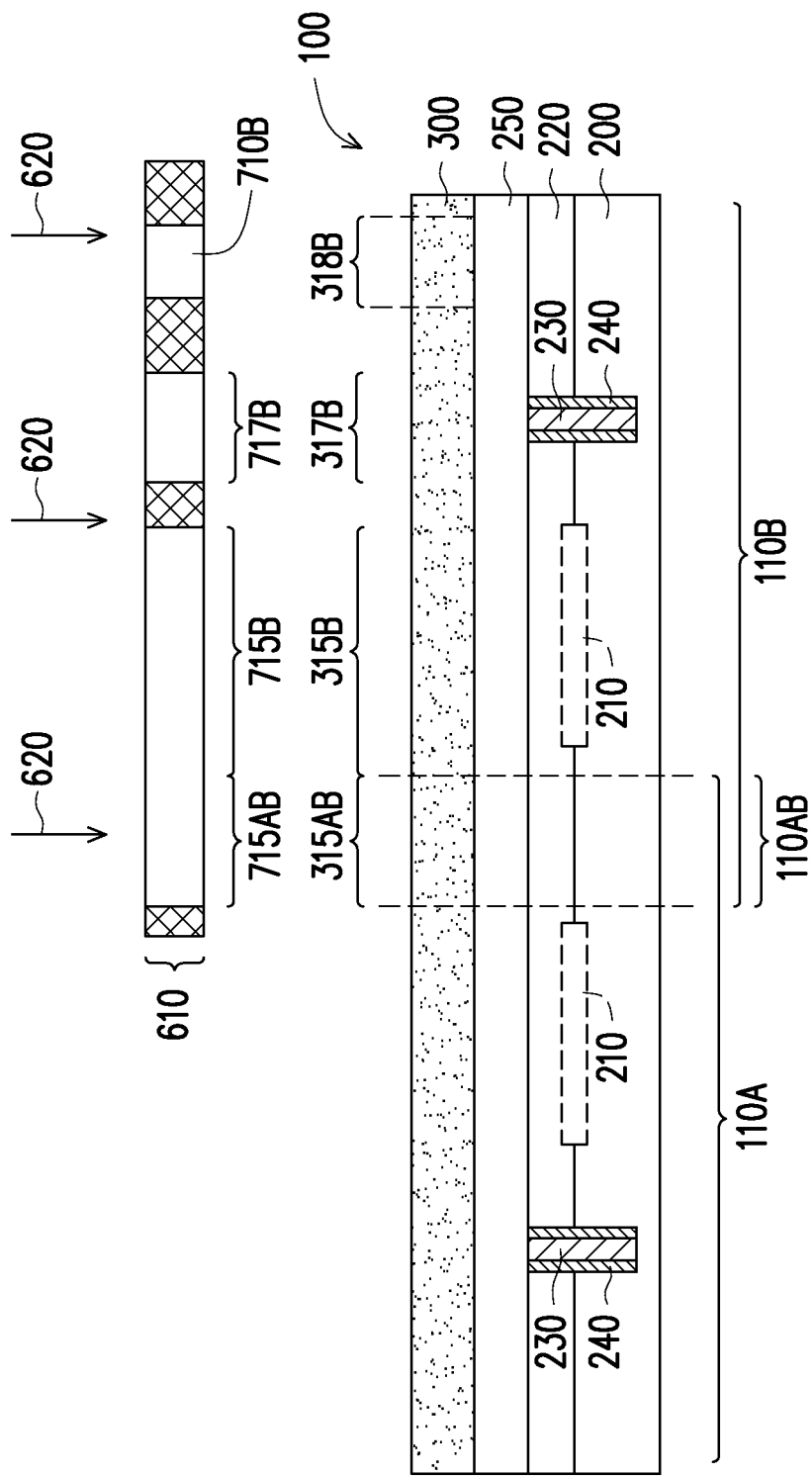

FIG. 7 is taken along the B-B cross-section of FIG. 8, and representatively illustrates another portion of second light-exposure 620 through second lithography mask 610. Concurrent with second light-exposure 620, photoresist portion 318B is exposed through mask opening 710B, photoresist portion 317B is exposed through mask opening 717B, photoresist portion 315B is exposed through mask opening portion 715B, and photoresist portion 315AB is exposed through mask opening portion 715AB, with remaining portions of photoresist 300 in the view of FIG. 7 not being exposed. Accordingly, the first overlay stitching zone 110AB may be referred to as being "double-exposed." Again, the respective step is shown as step 3130 in the process flow illustrated in FIG. 31, step 3230 in the process flow illustrated in FIG. 32, and step 3315 in the process flow illustrated in FIG. 33.

FIG. 8 representatively illustrates a schematic top view of photoresist 300 after first light-exposure 320, as shown in FIGS. 3 and 4, and after second light-exposure 620, as shown in FIGS. 6 and 7. Representative exposed regions are illustrated schematically, where the exposed regions of FIGS. 6, 7, and 8 are in or near second active signal region 110B. Exposed portions include portions 800B, 300B, 318B, 800AB, and 305AB, which correspond to exposed areas that will provide, after further processing, a second set of mask overlay alignment marks (indicated in the schematic illustration of FIG. 8 as circles). Exposed portions 800B, 300B, and 318B are near a peripheral edge of semiconductor die 100 within an L-shaped frame bordering second active signal region 110B. Exposed portions 800AB and 305AB are in first overlay stitching zone 110AB disposed between and interposing first active signal region 110A and second active signal region 110B. Exposed portions 800BD are in fourth overlay stitching zone 110BD disposed between and interposing second active signal region 110B and fourth active signal region 110D. Exposed portions 810 illustrate extension of the exposed areas of portions 510 into second active signal region 110B. Exposed portion 315' illustrates extension of the exposed area of portion 315 into second active signal region 110B. Exposed portions 810, 315', and 317B correspond to exposed areas that will provide, after further processing in subsequent steps, a set of active signal lines. Exposed portions 820 correspond to exposed areas that will provide, after further processing in subsequent steps, a set of active signal lines between second active signal region 110B and fourth active signal region 110D. In accordance with representative embodiments, any of first overlay stitching zone 110AB, second overlay stitching zone 110AC, third overlay stitching zone 110CD, or fourth overlay stitching zone 110BD may be about 80.3 microns wide along a respective narrowest dimension (i.e., perpendicular to a respective principal axis of a respective overlay stitching zone).

Figure 9:
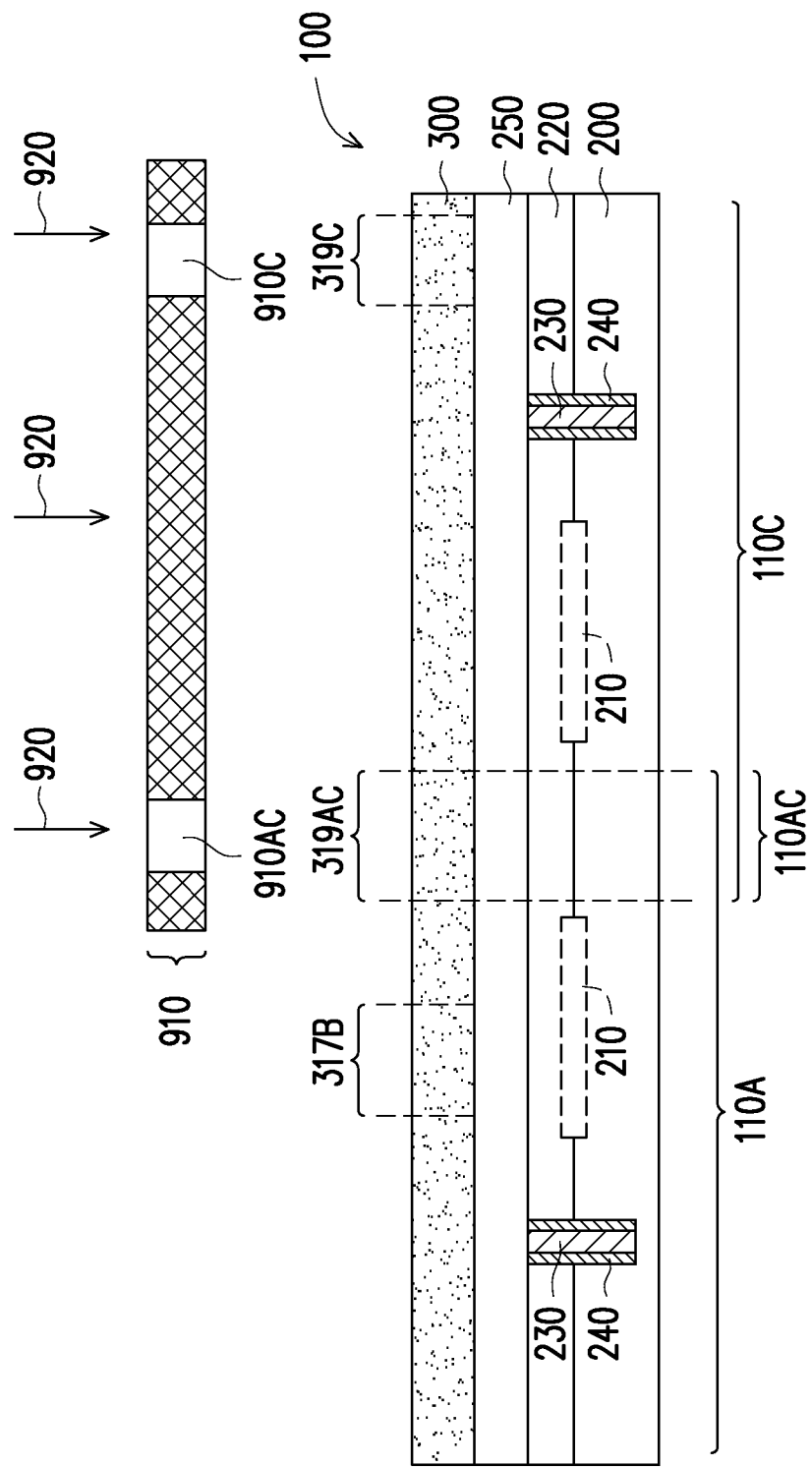
Figure 10:
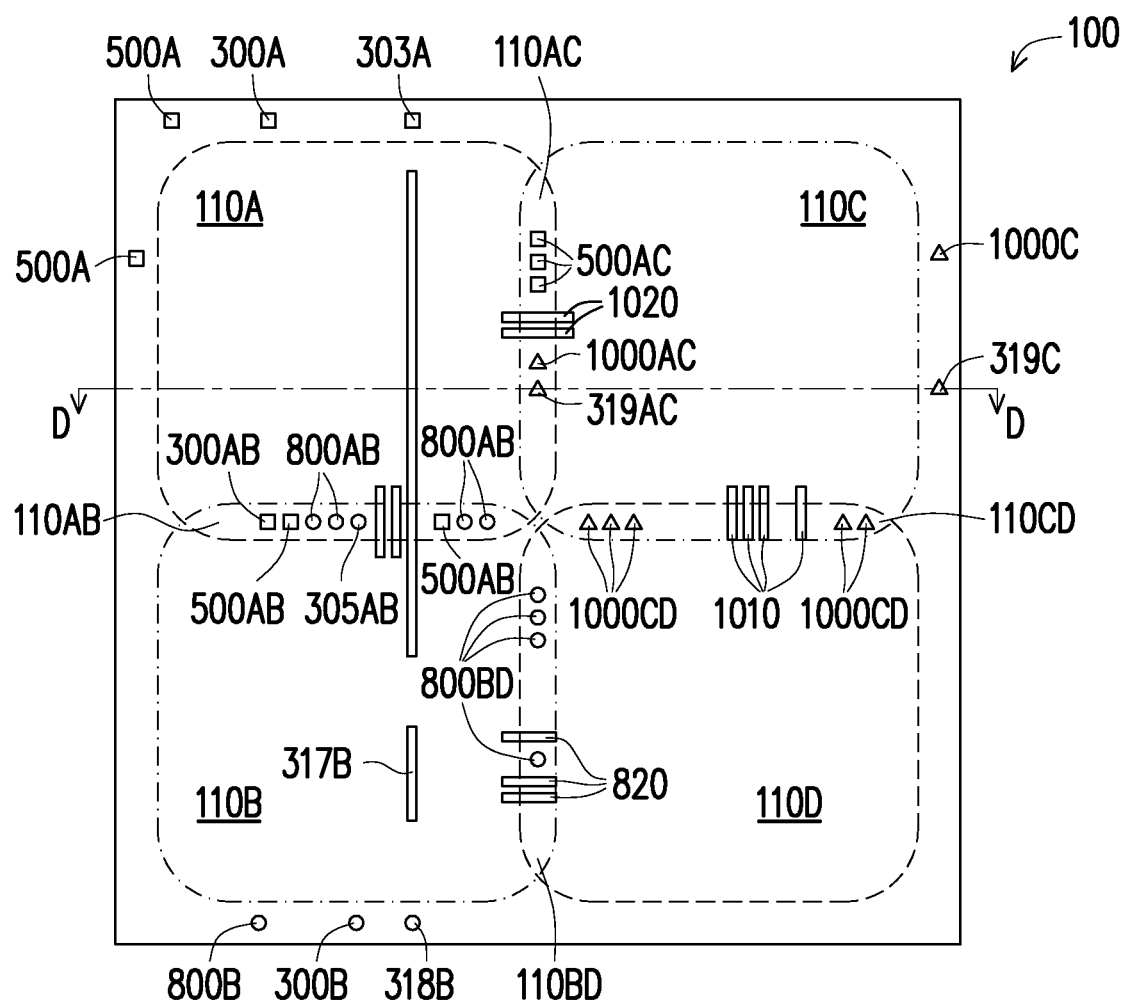

FIG. 9 is taken along the D-D cross-section shown in the schematic top view of exposed portions of photoresist 300 illustrated in FIG. 10. FIG. 9 representatively illustrates a third light-exposure 920 through a third lithography mask 910. Third lithography mask 910 is placed so as to expose (e.g., directly over) third active signal region 110C (including stitching zone 110AC). Third lithography mask 910, limited by its maximum size of the reticle field, is not large enough to simultaneously cover third active signal region 110C, fourth active signal region 100D, and first active signal region 110A. Rather, third lithography mask 910 is used to expose portions of photoresist 300 in third active signal region 110C, second overlay stitching zone 110AC, and third overlay stitching zone 110CD, but not first active signal region 110A, second active signal region 110B, or fourth active signal region 110D. Third light-exposure 920 is then performed to expose photoresist portion 319C through mask opening 910C, and photoresist portion 319AC through mask opening 910AC, with remaining portions of photoresist 300 in the view of FIG. 9 not being exposed. The respective step is shown as step 3140 (optional) in the process flow illustrated in FIG. 31, step 3240 (optional) in the process flow illustrated in FIG. 32, and step 3320 in the process flow illustrated in FIG. 33.

FIG. 10 representatively illustrates a schematic top view of photoresist 300 after first light-exposure 320, as shown in FIGS. 3 and 4, after second light-exposure 620, as shown in FIGS. 6 and 7, and after third light-exposure 920, as shown in FIG. 9. Representative exposed regions are illustrated schematically, where the exposed regions of FIGS. 9 and 10 are in or near third active signal region 110C. Exposed portions include portions 1000C, 319C, 1000AC, 319AC, and 1000CD, which correspond to exposed areas that will provide, after further processing, a third set of mask overlay alignment marks (indicated in the schematic illustration of FIG. 10 as triangles). Exposed portions 1000C and 319C are near a peripheral edge of semiconductor die 100 within an L-shaped frame bordering third active signal region 110C. Exposed portions 1000AC and 319AC are in second overlay stitching zone 110AC disposed between and interposing first active signal region 110A and third active signal region 110C. Exposed portions 1000CD are in third overlay stitching zone 110CD disposed between and interposing third active signal region 110C and fourth active signal region 110D. Exposed portions 1020 illustrate extension of the exposed areas of portions 520 into third active signal region 110C. Exposed portions 1010 correspond to exposed areas that will provide, after further processing in subsequent steps, a set of active signal lines between third active signal region 110C and fourth active signal region 110D.

Figure 11:
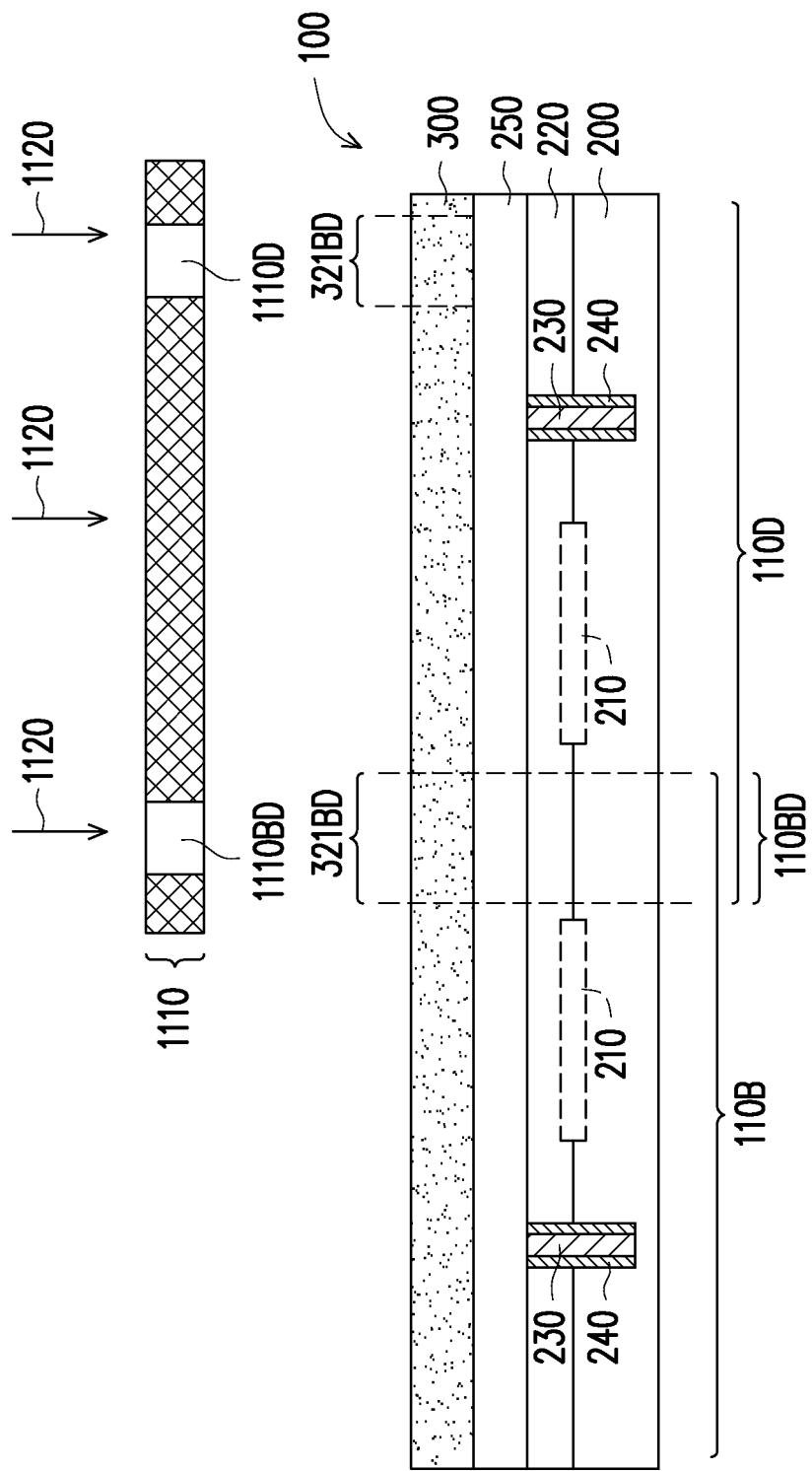
Figure 12:
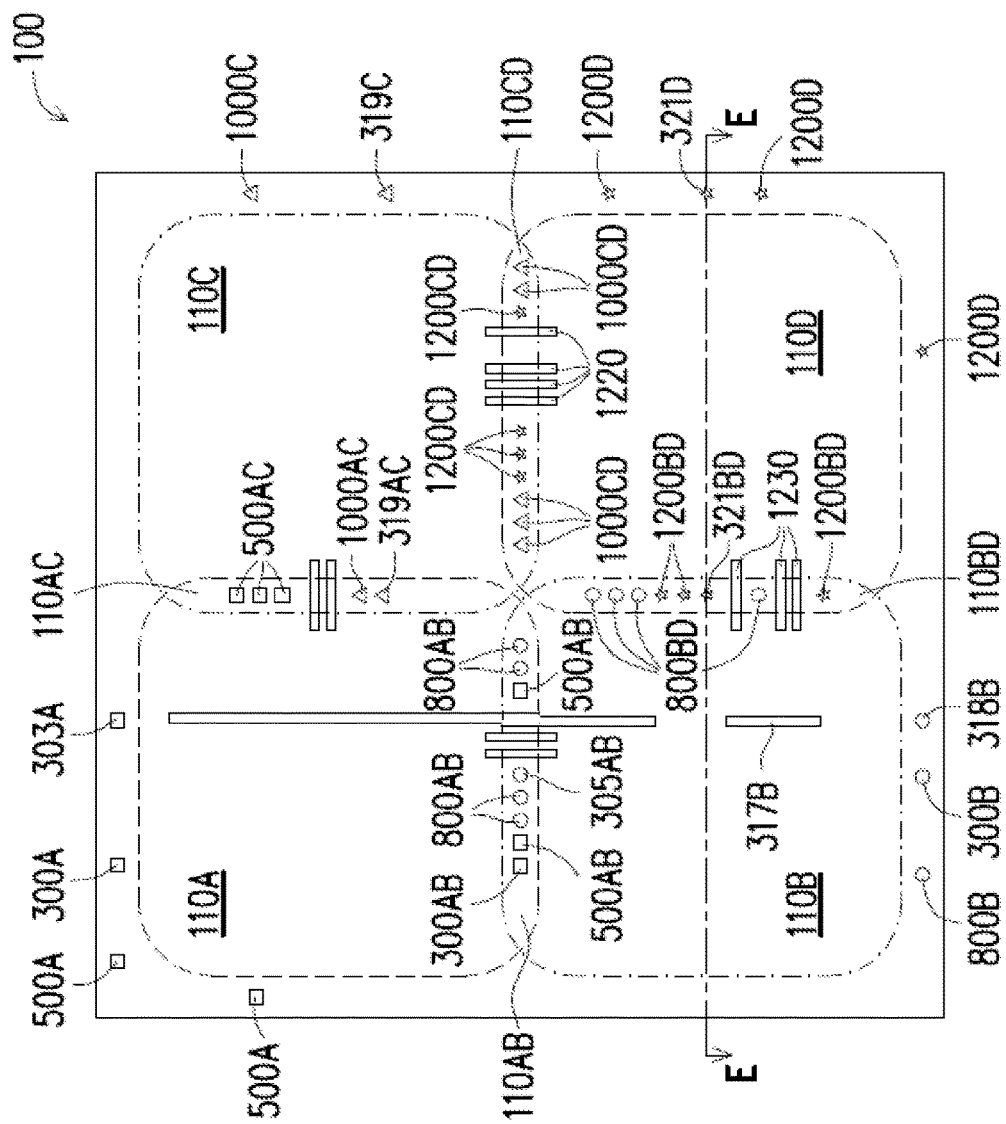

FIG. 11 is taken along the E-E cross-section shown in the schematic top view of exposed portions of photoresist 300 illustrated in FIG. 12. FIG. 11 representatively illustrates a fourth light-exposure 1120 through a fourth lithography mask 1110. Fourth lithography mask 1110 is placed so as to expose (e.g., directly over) fourth active signal region 110D (including stitching zones 110BD and 110CD). Fourth lithography mask 1110, limited by its maximum size of the reticle field, is not large enough to simultaneously cover fourth active signal region 110D, second active signal region 100B, and third active signal region 110C. Rather, fourth lithography mask 1110 is used to expose portions of photoresist 300 in fourth active signal region 110D, third overlay stitching zone 110CD, and fourth overlay stitching zone 110BD, but not first active signal region 110A, second active signal region 110B, or third active signal region 110C. Fourth light-exposure 1120 is then performed to expose, e.g., photoresist portion 321D through mask opening 1110D, and photoresist portion 321BD through mask opening 110BD, with remaining portions of photoresist 300 in the view of FIG. 11 not being exposed. The respective step is shown as step 3150 (optional) in the process flow illustrated in FIG. 31, step 3250 (optional) in the process flow illustrated in FIG. 32, and step 3325 in the process flow illustrated in FIG. 33.

FIG. 12 representatively illustrates a schematic top view of photoresist 300 after first light-exposure 320, as shown in FIGS. 3 and 4, after second light-exposure 620, as shown in FIGS. 6 and 7, after third light-exposure 920, as shown in FIG. 9, and after fourth light-exposure 1120, as shown in FIG. 11. Representative exposed regions are illustrated schematically, where the exposed regions of FIGS. 11 and 12 are in or near fourth active signal region 110D. Exposed portions include portions 1200D, 321D, 1200CD, 1200BD, and 321BD, which correspond to exposed areas that will provide, after further processing, a fourth set of mask overlay alignment marks (indicated in the schematic illustration of FIG. 12 as stars). Exposed portions 1200D and 321D are near peripheral edges of semiconductor die 100 within an L-shaped frame bordering fourth active signal region 110D. Exposed portions 1200CD are in third overlay stitching zone 110CD disposed between and interposing third active signal region 110C and fourth active signal region 110D. Exposed portions 1200BD and 321BD are in fourth overlay stitching zone 110BD disposed between and interposing second active signal region 110B and fourth active signal region 110D. Exposed portions 1220 illustrate extension (e.g., a joining of the patterns imaged in the third light-exposure 920 and the fourth light exposure 1120) of the exposed areas of portions 1010 into fourth active signal region 110D—corresponding to exposed areas that will provide, after further processing in subsequent steps, a set of active signal lines between third active signal region 110C and fourth active signal region 110D. Exposed portions 1230 illustrate extension of the exposed areas of portions 820 into fourth active signal region 110D (e.g., a joining of the patterns imaged in the second light-exposure 620 and the fourth light exposure 1120) corresponding to exposed areas that will provide, after further processing in subsequent steps, a set of active signal lines between second active signal region 110B and fourth active signal region 110D.

By using four light-exposures 320, 620, 920, 1120 with different lithography masks, conductive features may expand beyond the area of a single reticle field. This joining of patterns in and across overlay stitching regions 110AB, 110AC, 110CD, and 110BD is referred to as "stitching."

Double exposed portions in overlay stitching regions 110AB, 110AC, 110CD, and 110BD are light-exposed twice. Accordingly, the widths of double exposed portions may be greater than the width of portions internally imaged in any of active signal regions 110A, 110B, 110C, or 110D not also occupying overlay stitching regions 110AB, 110AC, 110CD, or 110BD. 110BD (only one of which is illustrated in FIG. 12). Additionally, if one or any of lithography masks 310, 610, 910, or 1110 are not aligned accurately, various features may not be aligned to a straight line, and may be shifted (but parallel with each other) or slanted (joined and not parallel), even if the various features are otherwise defined in the lithography masks as being a continuous straight strip having a uniform width. Similarly, various features may not be aligned to a straight line.

Figure 13:
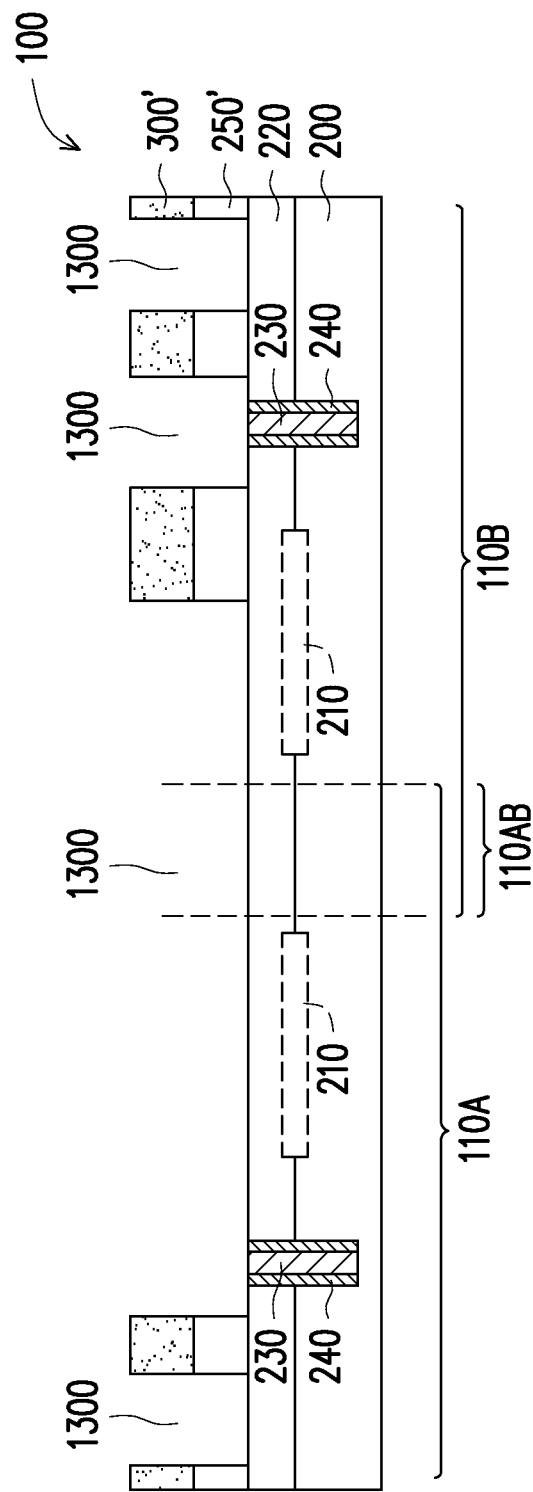

Next, a photoresist development is performed, where exposed portions (including double-exposed portions in overlay stitching regions 110AB, 110AC, 110CD, and 110BD) are removed, with unexposed portions of photoresist 300 remaining. The respective step is shown as step 3160 in the process flow illustrated in FIG. 31, step 3260 in the process flow illustrated in FIG. 32, and step 3330 in the process flow illustrated in FIG. 33. A portion of the resulting structure along the B-B cross-section of FIG. 8 is shown in FIG. 13. For considerations herein servicing brevity, further processing of semiconductor die 100 will be discussed with reference to illustration of resulting structure along the B-B cross-section of FIG. 8 as between the first active signal region 110A and second active signal region 110B; however, skilled artisans may readily extrapolate the indicated processing to structures that may be produced in other active signal regions.

Developed photoresist 300' is used as an etching mask to etch the underlying IMD layer 250, resulting in trenches 1300 in patterned IMD layer 250'. The respective step is shown as step 3160 in the process flow illustrated in FIG. 31, step 3260 in the process flow illustrated in FIG. 32, and step 335 in the process flow illustrated in FIG. 33. If there is an etch stop layer over ILD layer 220, the etch stop layer is also etched through. Through-vias 230 are exposed to trenches 1300 in accordance with some embodiments. Remaining developed photoresist 300' is thereafter removed.

Figure 14:
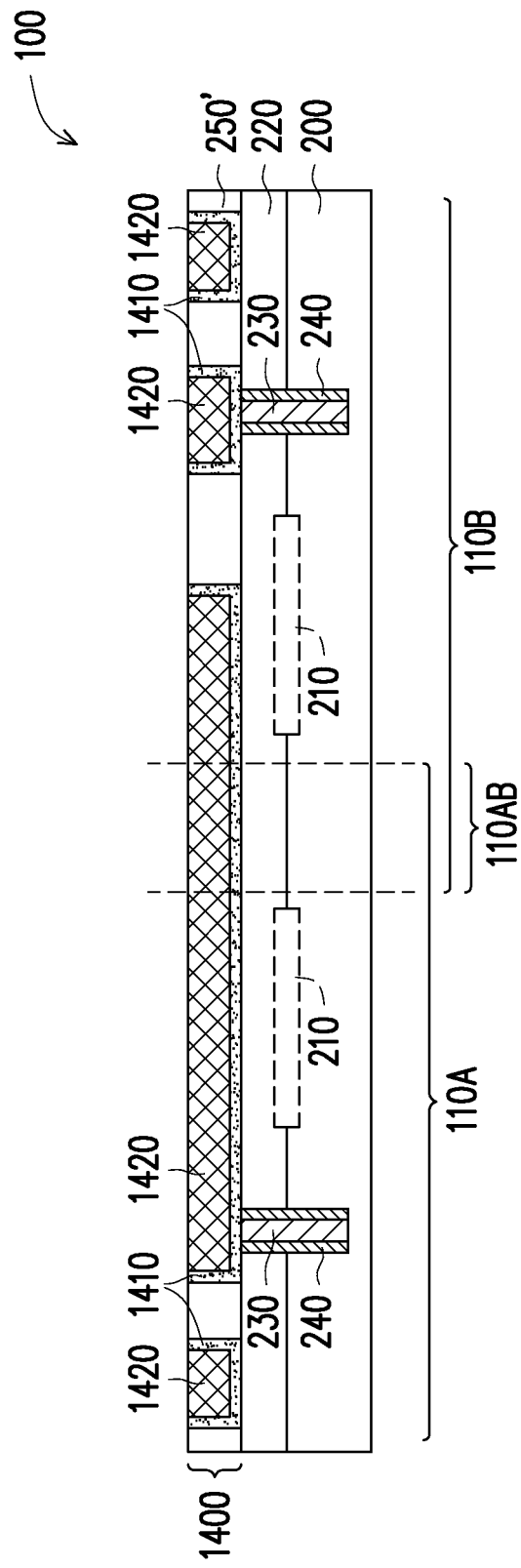

Referring to FIG. 14, conductive lines 1400 are formed in patterned IMD layer 250'. The respective step is shown as step 3340 in the process flow illustrated in FIG. 33. In accordance with some embodiments, metal lines 1400 include diffusion barrier layers 1410 and copper-containing material 1420 over diffusion barrier layer(s) 1410. One or more diffusion barrier layers 1410 may include titanium, titanium nitride, tantalum, tantalum nitride, or the like. Diffusion barrier layers 1410 have the function of preventing copper (e.g., in copper-containing material 1420) from diffusing into patterned IMD layer 250'. Conductive lines 1400 are referred to as metal lines 1400 hereinafter. The formation of metal lines 1400 may include forming a blanket diffusion barrier layer 1410, depositing the copper-containing material 1420 (for example, with plating), and then performing a planarization (e.g., chemical mechanical polishing (CMP)) to remove excess portions of barrier layer 1410 and copper-containing material 1420.

Figure 15:
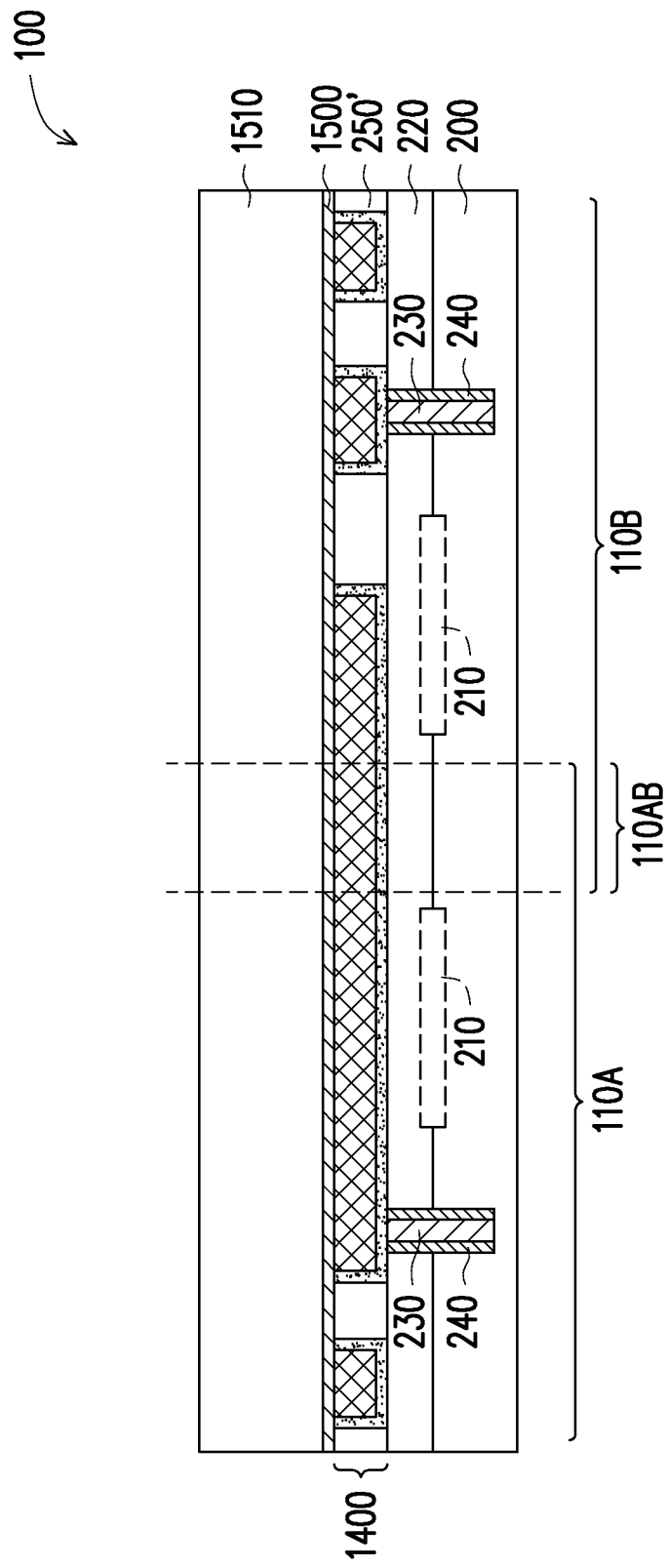

FIG. 15 illustrates formation of etch stop layer (ESL) 1500 over patterned IMD layer 250' and metal lines 1400, and formation of low-k dielectric layer 1510 over ESL 1500. ESL 1500 may be formed of a nitride, a silicon-carbon-based material, a carbon-doped oxide, or combinations thereof. Formation methods include plasma enhanced chemical vapor deposition (PECVD) or other methods such as high-density plasma CVD (HDPCVD), atomic layer deposition (ALD), or the like. In accordance with some embodiments, ESL 1500 is a diffusion barrier layer that may be used for preventing undesirable elements, such as copper, from diffusing into a subsequently formed low-k dielectric layer. ESL 1500 may also act as both an etch stop layer and a diffusion barrier layer.

FIG. 15 also illustrates formation of dielectric layer 1510, which may be a low-k dielectric layer or a non-low-k dielectric layer. Low-k dielectric layer 1510 may have a k-value lower than about 3.5, or lower than about 2.5. Materials comprising low-k dielectric layer 1510 may include a carbon-containing material, an organo-silicate glass, a porogen-containing material, or combinations thereof. Low-k dielectric layer 1510 may be deposited using PECVD, or other commonly-used deposition methods, such as LPCVD, ALD, spin-on, or the like.

Figure 33:
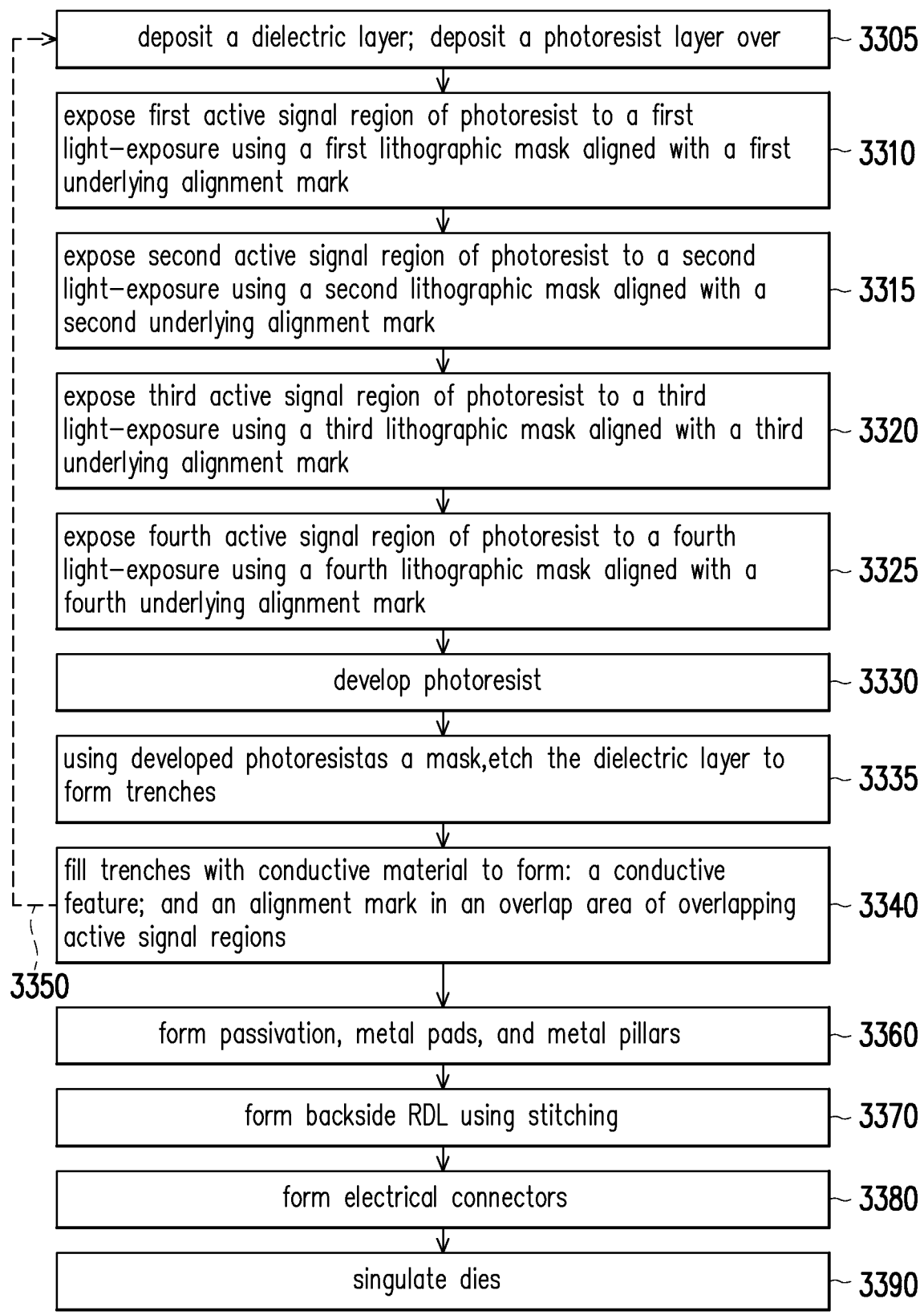

FIGS. 16 through 22 illustrate formation of metal lines and vias using a dual damascene process, where the respective process steps are represented as a looping of steps 3305 through 3350 in the process flow shown in FIG. 33. FIGS. 16 through 20 illustrate formation of via openings and trenches in accordance with some embodiments. It will be appreciated that the illustrated via-first approach is used as an example to show how via openings and trenches may be formed, while other approaches such as via-last, metal hard mask, or the like, may be alternatively, conjunctively, or sequentially employed. It will also be appreciated that the stitching concepts described herein can also be applied to such other approaches.

Figure 16:
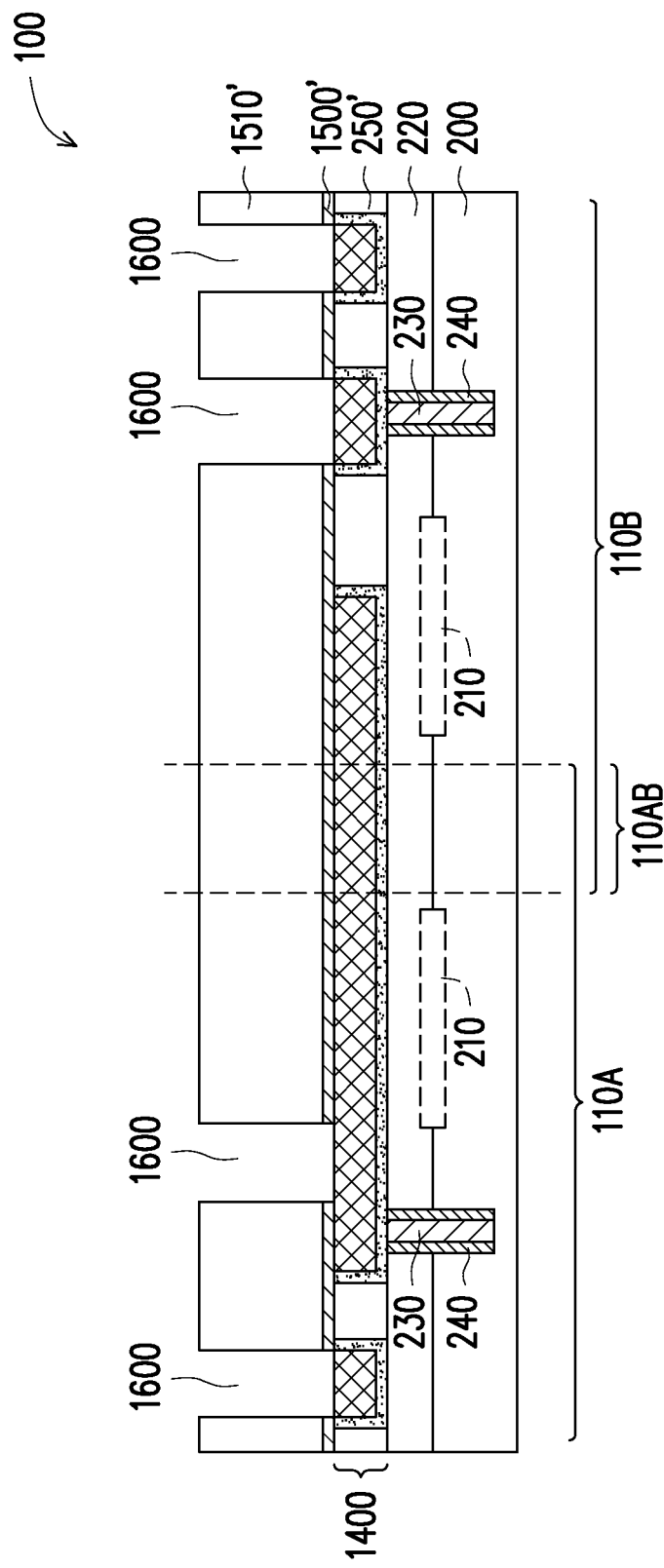

As representatively illustrated in FIG. 16, via openings 1600 are formed. Formation may be achieved using the double-exposure methods as described with reference to FIGS. 3 through 13, the details of which are not repeated herein for brevity. In accordance with some embodiments, via openings 1600 are formed in portions of active signal regions 110A and 110B other than those occupying overlay stitching zone 110AB.

Figure 17:
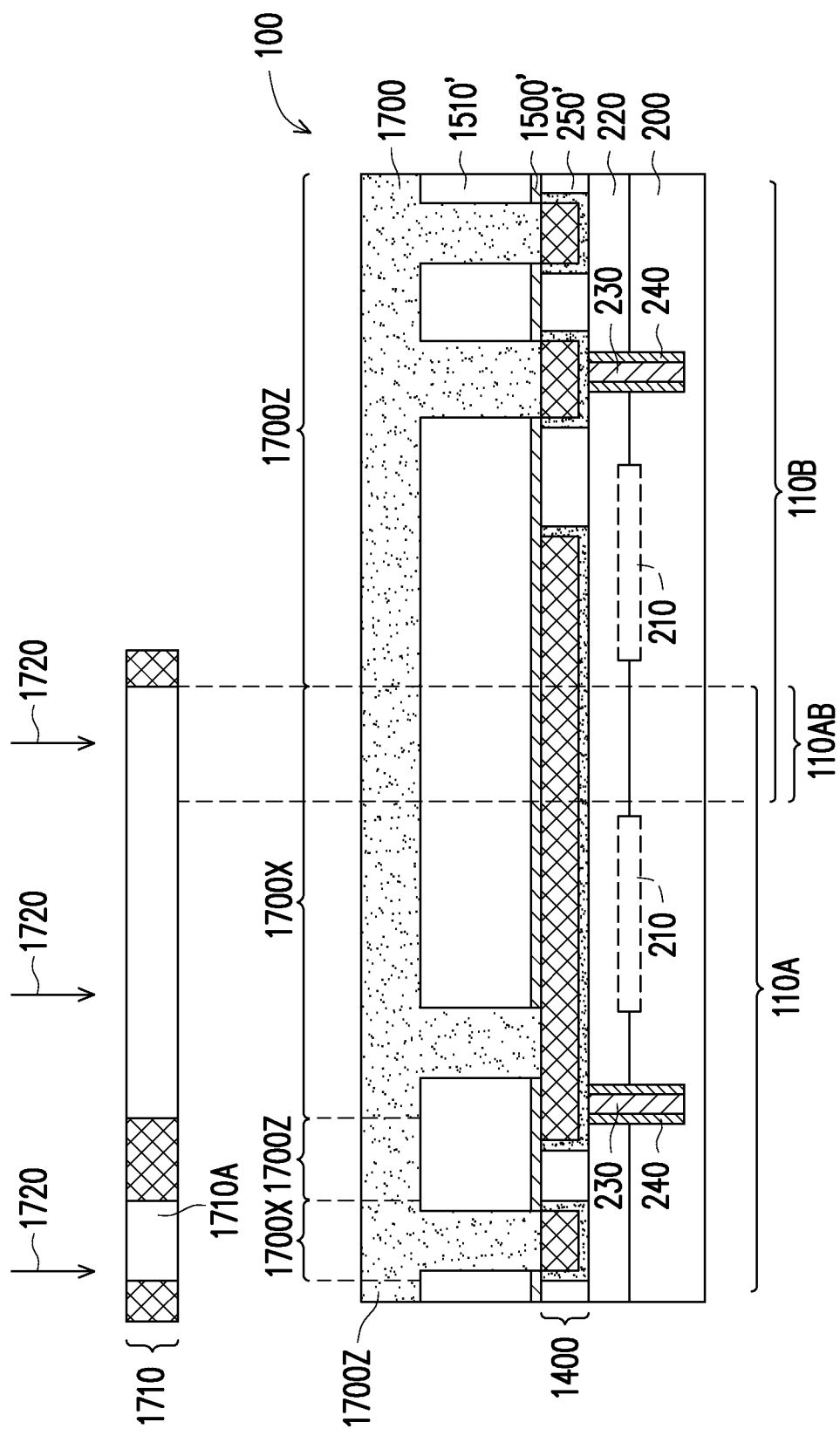

Next, referring to FIG. 17, photoresist 1700 is applied over patterned IMD layer 1510'. Lithography mask 1710 is then placed so as to expose (e.g., directly over) region 110A (including stitching zone 110AB). Lithography mask 1710 is then aligned to underlying metal features using one or more of underlying mask overlay alignment marks 500AC, 1000AC, or 319AC (not shown in FIG. 17) in second overlay stitching zone 110AC, and/or mask overlay alignment marks 300AB, 500AB, 800AB, or 305AB (also not shown in FIG. 17) in first overlay stitching zone 110AB, as representatively illustrated in FIG. 12. Once lithography mask 1710 is registered to the underlying metal pattern of the immediately prior damascene process using the mask overlay alignment mark(s), lithography mask 1710 is used to expose portions of photoresist 1700 in active signal region 110A and overlay stitching zone 110AB, but not active signal region 110B. Light-exposure 1720 is then performed to expose portions 1700X of photoresist 1700, while portions 1700Z are not exposed.

Figure 18:
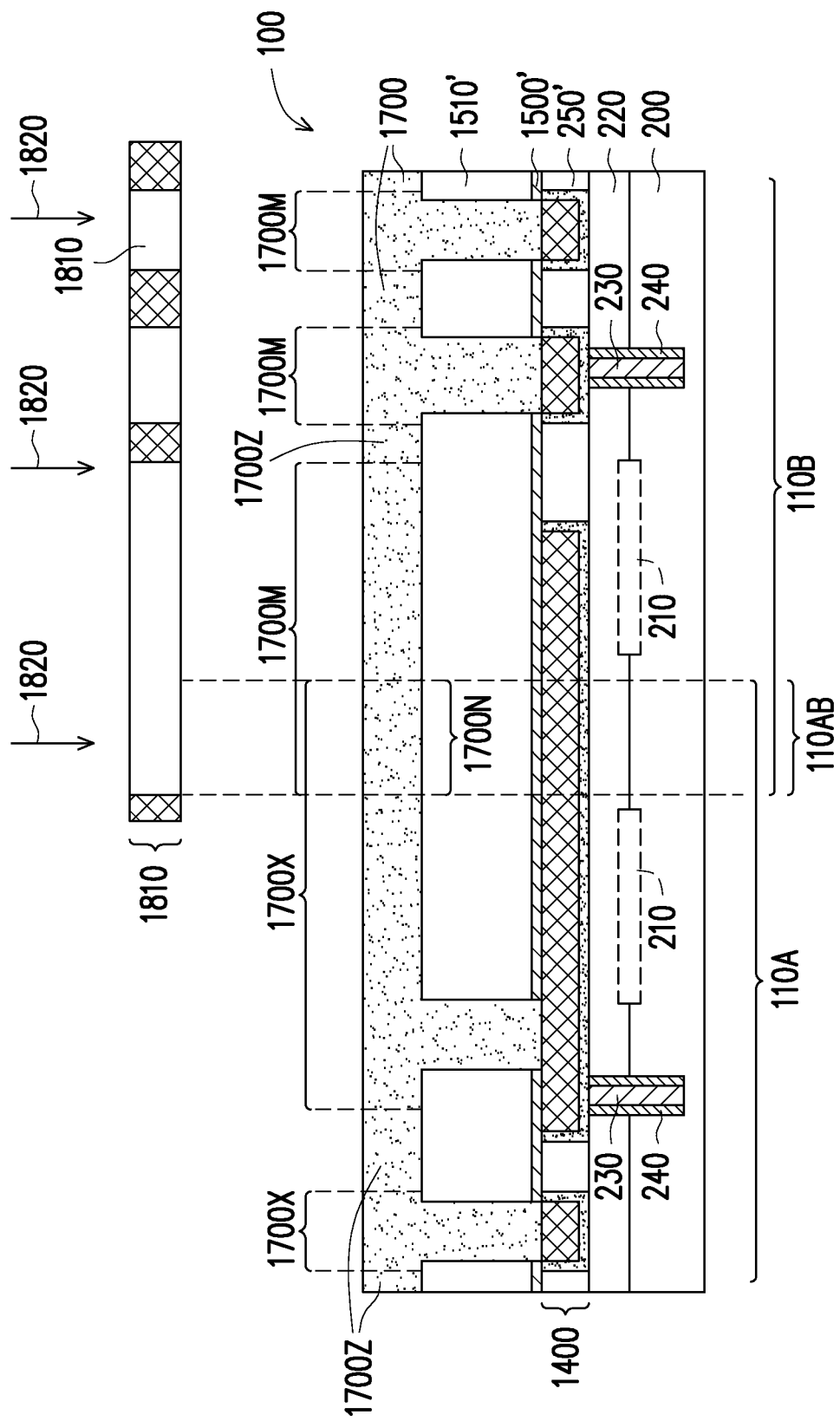

Referring to FIG. 18, lithography mask 1810 is placed directly over active signal region 110B (including stitching zone 110AB). Lithography mask 1810 is then aligned to underlying metal features using one or more of underlying mask overlay alignment marks 300AB, 500AB, 800AB, or 305AB (not shown in FIG. 18) in first overlay stitching zone 110AB, and/or mask overlay alignment marks 800BD, 1200BD, or 321BD (also not shown in FIG. 18) in fourth overlay stitching zone 110BD, as representatively illustrated in FIG. 12. See, e.g., for example, step 3170 of FIG. 31 and step 3270 of FIG. 32. Once lithography mask 1710 is registered to the underlying metal pattern of the immediately prior damascene process using the mask overlay alignment mark(s), lithography mask 1810 is used to expose portions of photoresist 1700 in active signal region 110B and overlay stitching zone 110AB, but not active signal region 110A. Light-exposure 1820 is then performed to expose portions 1700M of photoresist 1700, while portions 1700Z are not exposed. Some of the exposed portions 1700M overlap parts of the exposed portions 1700X that have been exposed in the process step shown in FIG. 17. The overlap regions of portions 1700X and 1700M are referred to as double-exposed portions 1700N hereinafter. Double exposed portions 1700N are in overlay stitching zone 110AB. It will be appreciated that light-exposures 1720 and 1820 will expose other regions of overlay stitching zone 110AB (e.g., not illustrated in the B-B cross-section) that, after subsequent processing, will provide additional mask overlay alignment marks that may be used to align a subsequent lithography mask of the next damascene process in order to register a subsequent lithographic pattern with the metal pattern produced in the immediately preceding damascene process.

As previously discussed and in similar fashion, double-exposed portions 1700N are light-exposed twice. Accordingly, the widths of double exposed portions 1700N may be greater than those of single-exposed portions 1700X and 1700M. Similarly, if one or both lithography masks 1710 (FIG. 17) and 1810 (FIG. 18) are not aligned accurately, various exposed portions may not be aligned to a straight line, and may be shifted or slanted, even if the various exposed portions are otherwise defined in the lithography masks as being a continuous, straight strip having a uniform width. Exposed portions that are joined in overlay stitching zones may avoid excessive or otherwise out-of-specification shifting or slanting in accordance with various representative embodiments that utilize mask overlay alignment marks inside overlay stitching zones disposed between and interposing adjacent active signal regions in a same die.

Figure 19:
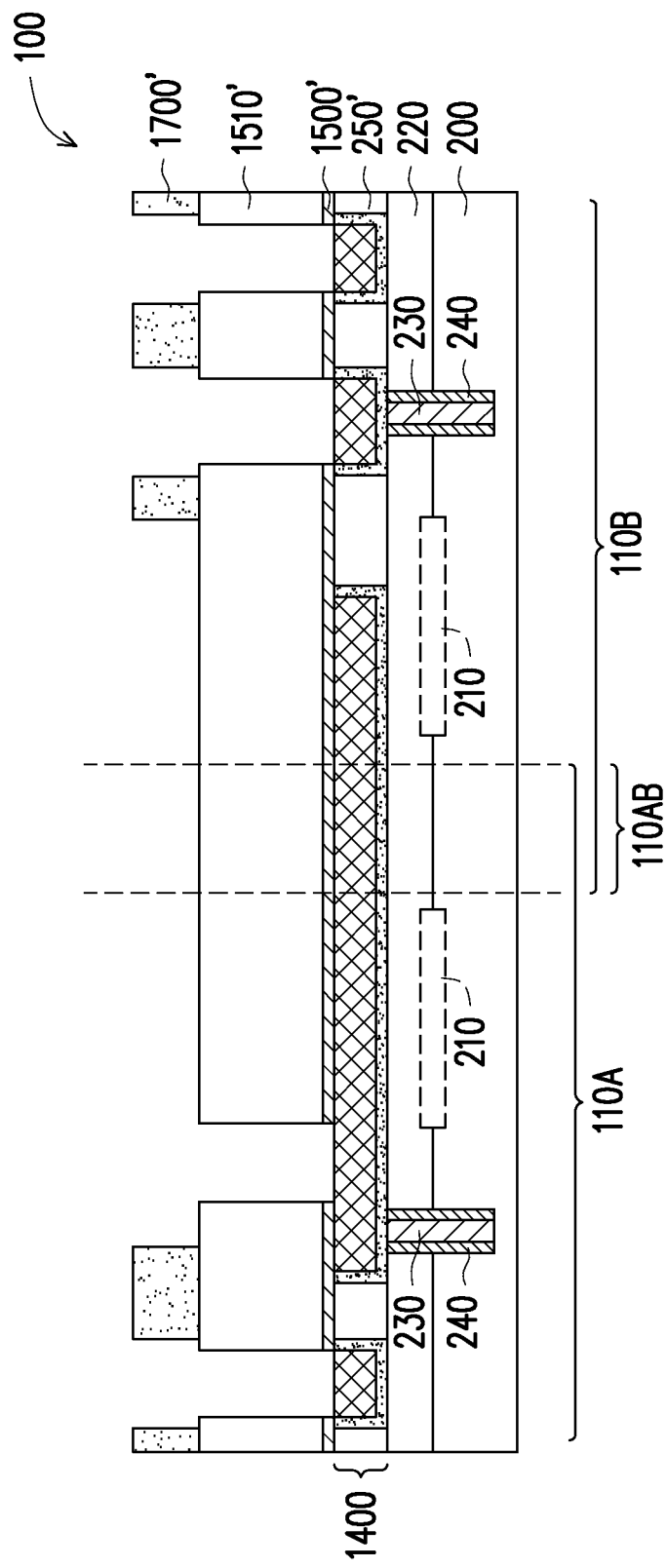
Figure 20:
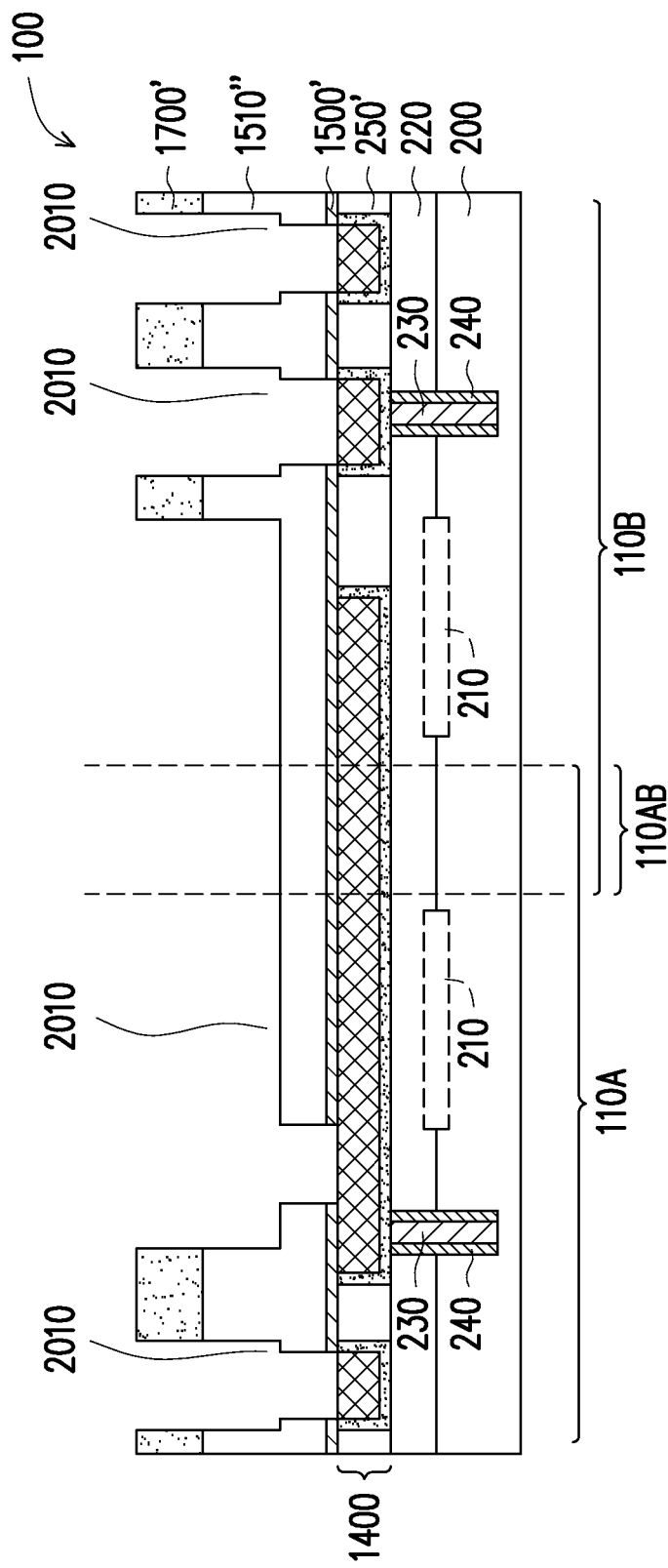
Figure 21:
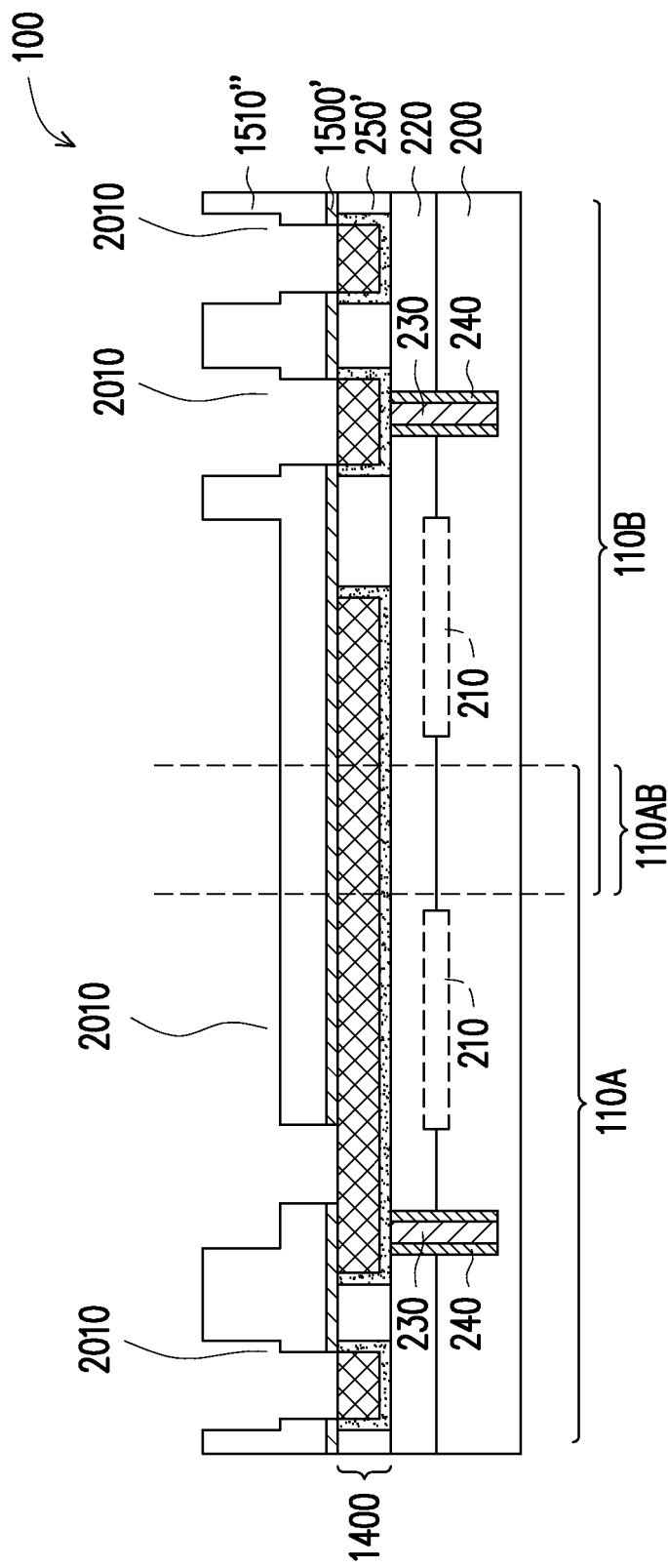

Next, a photoresist development is performed, and exposed portions 1700X and 1700M, including double-exposed regions 1700N, are removed, with unexposed portions 1700Z remaining. The resulting patterned photoresist 1700' is shown in FIG. 19. In a subsequent step, as representatively illustrated in FIG. 20, patterned photoresist 1700' is used as an etching mask to etch the underlying patterned IMD layer 1510', resulting in trenches 2010 in twice-patterned IMD layer 1510". Remaining portions of patterned photoresist 1700' are then removed, as shown in FIG. 21.

Figure 22:
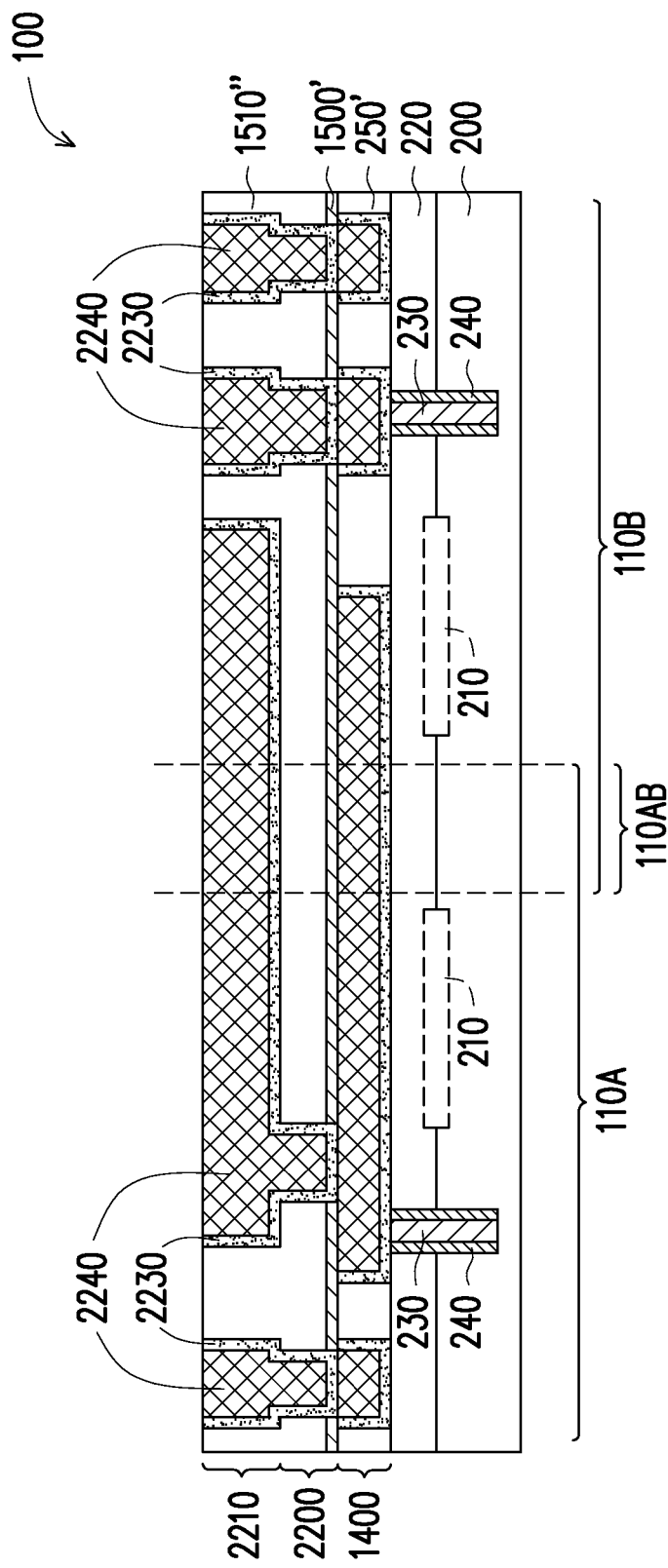

Next, with reference to FIG. 22, conductive lines 2210 and vias 2200 are formed in IMD layer 1510". In accordance with some embodiments, metal lines 2210 and vias 2200 include diffusion barrier layers 2230, and copper-containing material 2240 over diffusion barrier layers 2230. Diffusion barrier layers 2230 may include titanium, titanium nitride, tantalum, tantalum nitride, or the like. Conductive lines 2210 are referred to as metal lines 2210, hereinafter. The formation of metal lines 2210 and vias 2200 include forming a blanket diffusion barrier layer 2230, forming the copper-containing material 2240 (e.g., with plating), and then performing a planarization such as CMP to remove excess portions of the barrier layer 2230 and copper-containing material 2240.

Figure 23:
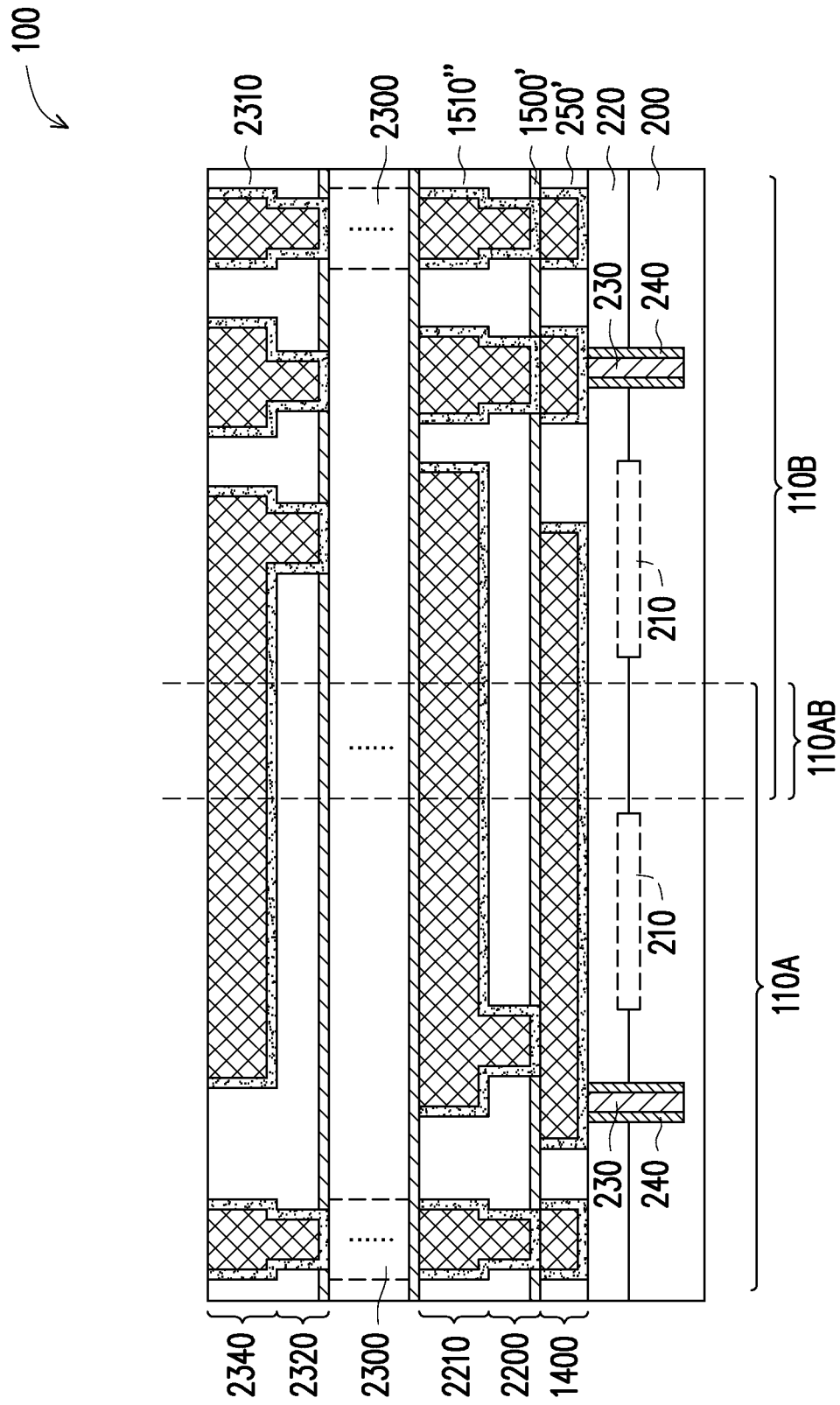

FIG. 23 representatively illustrates formation of additional IMD layers, metal lines, and vias over IMD layer 1510". For example, a top metal layer and respective underlying vias are illustrated. A top metal layer includes metal lines 2340 and vias 2320 formed in IMD layer 2310. The formation processes and materials of metal lines 2340, vias 2320, and IMD layer 2310 are similar to the formation processes and materials of metal lines 2210, vias 2200, and IMD layer 1510", respectively; the details of which are not repeated herein for brevity. There may be a plurality 2300 of metal layers between IMD layer 1510" and IMD layer 2310 (e.g., as representatively indicated by looping step 3350 illustrated in FIG. 33).

Figure 24:
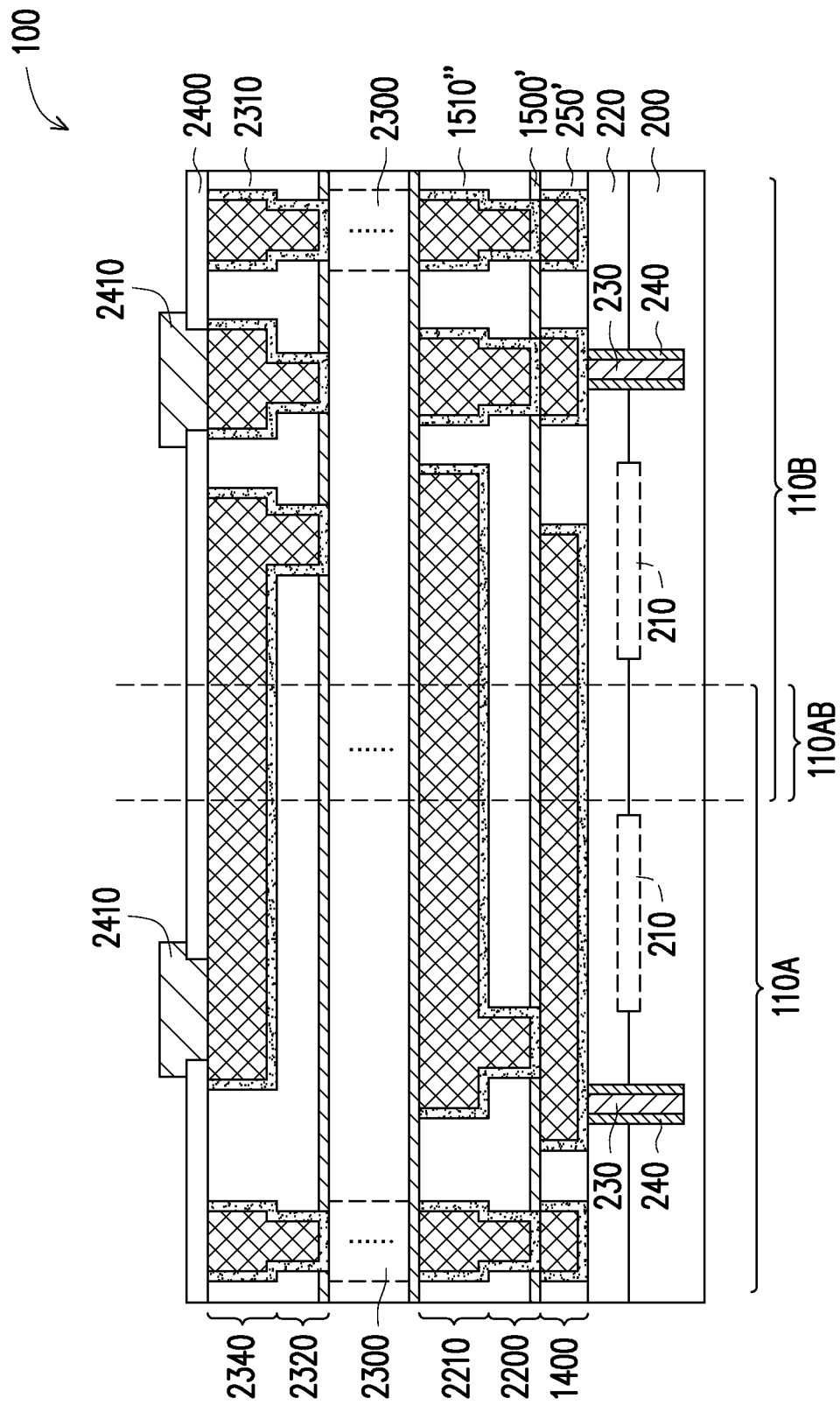

As shown in FIG. 24, passivation layer 2400 is formed over the resulting interconnect structure. The respective step is shown as step 3360 in the process flow illustrated in FIG. 33. Passivation layer 2400 has a k-value greater than 3.8, and is formed using a non-low-k dielectric material. In accordance with some embodiments of the present disclosure, passivation layer 2400 is a composite layer including a silicon oxide layer (not illustrated), and a silicon nitride layer (also not illustrated) over the silicon oxide layer. Passivation layer 2400 may also be formed of other non-porous dielectric materials such as undoped silicate glass (USG), silicon oxynitride, or the like.

Passivation layer 2400 is patterned, and metal pads 2410 are formed to penetrate through passivation layer 2400 to connect to metal lines 2340. The respective step is also shown as step 3360 in the process flow illustrated in FIG. 33. Metal pads 2410 may be aluminum pads or aluminum-copper pads, and hence are alternatively referred to as aluminum pads 2410 hereinafter, while other metallic materials may be alternatively or conjunctively used. For example, metal pads 2410 may have an aluminum percentage (atomic) between about 99.5 percent and about 99.9 percent, and a copper percentage (atomic) between about 0.1 percent and about 0.5 percent.

Figure 25:
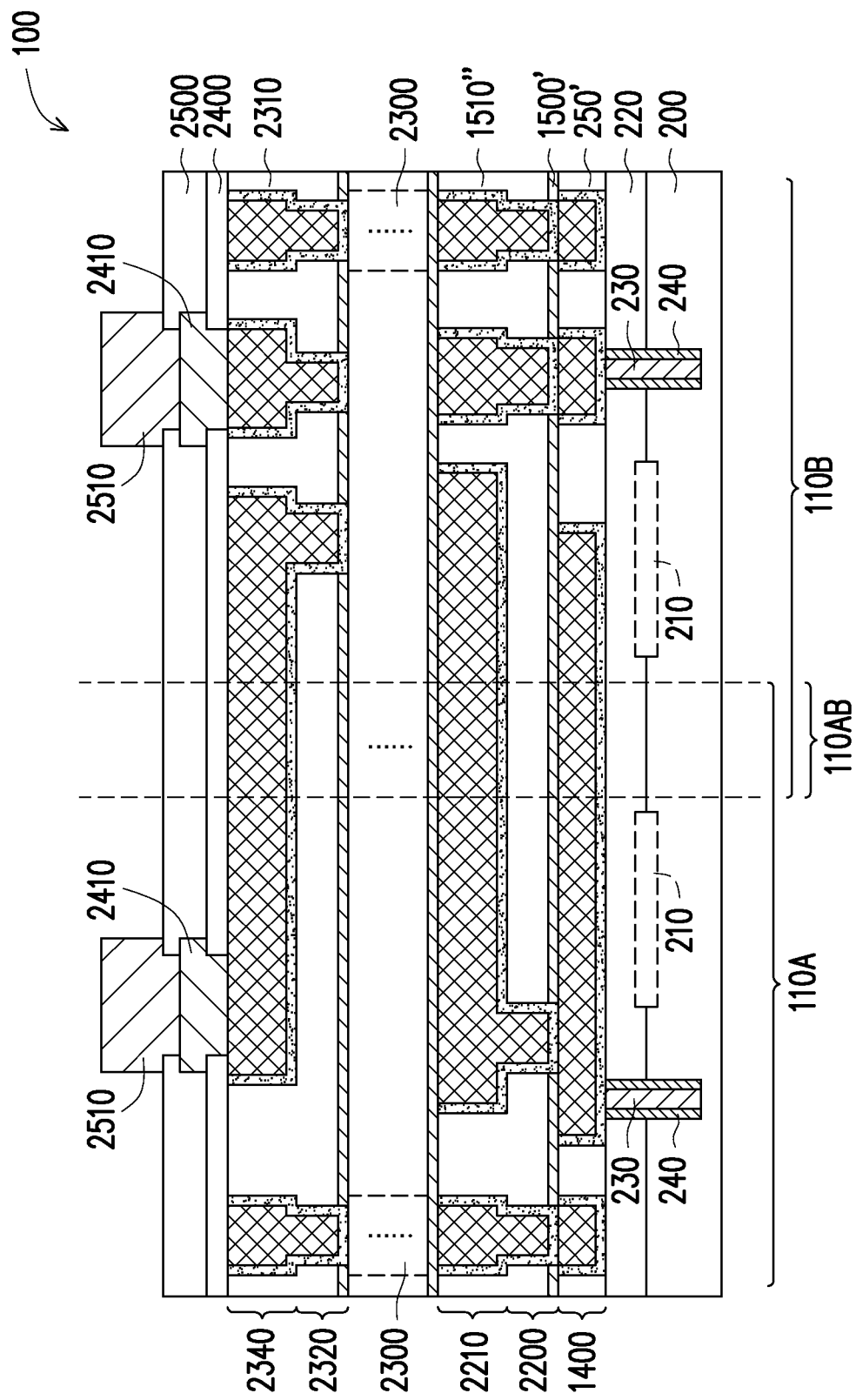

FIG. 25 representatively illustrates formation of passivation layer 2500 and conductive pillars 2510. The respective step is shown as step 3360 in the process flow illustrated in FIG. 33. Passivation layer 2500 may be formed of similar materials as passivation layer 2400. Some portions of passivation layer 2500 cover edge portions of metal pads 2410, and central portions of metal pads 2410 are exposed through openings in passivation layer 2400. Conductive pillars 2510 are formed to extend into openings in passivation layer 2400, and are electrically connected to metal pads 2410.

Figure 26:
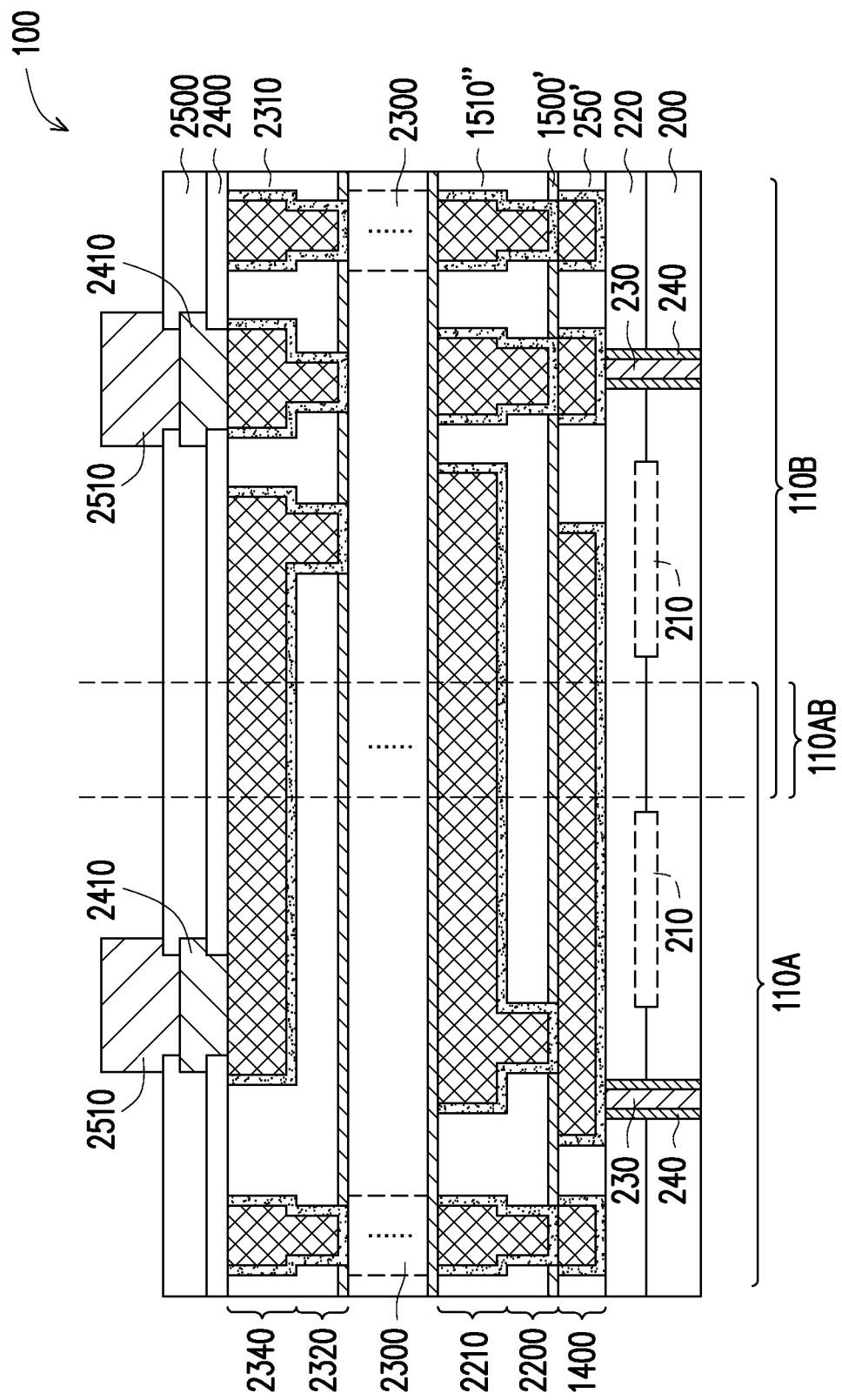
Figure 27:
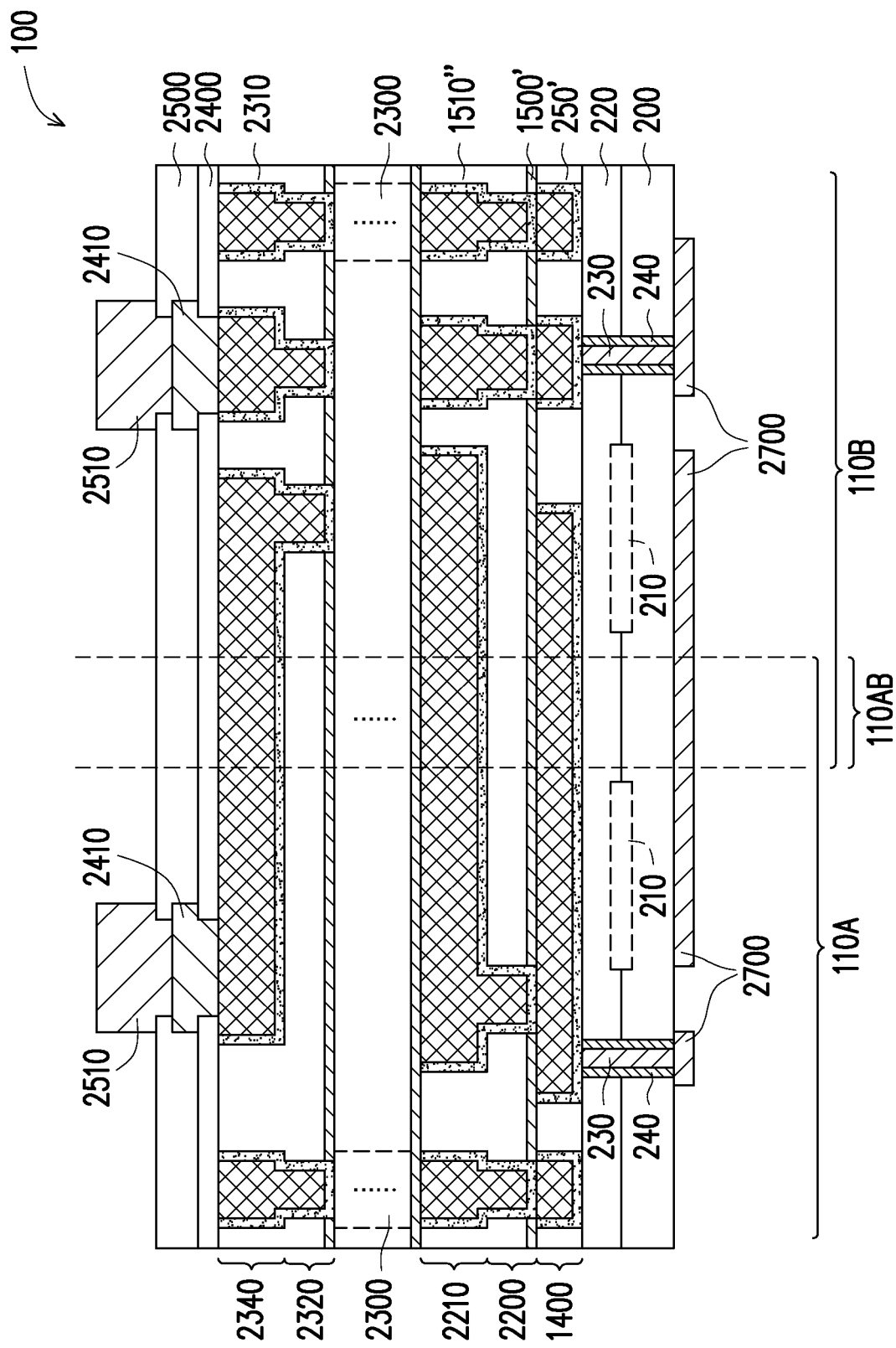
Figure 28:
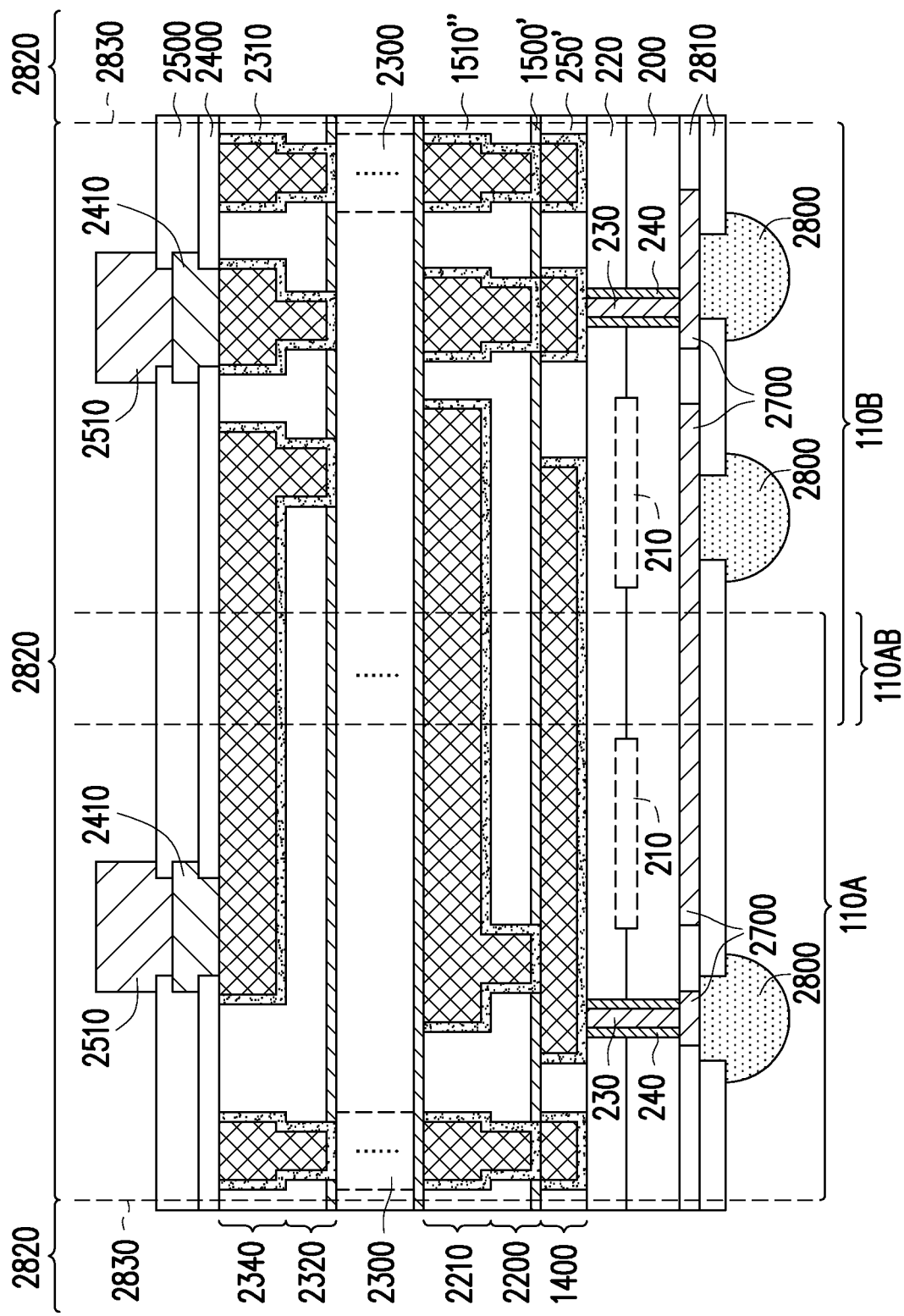

FIGS. 26 through 28 illustrate a backside process performed on semiconductor die 100. Referring to FIG. 26, a backside grinding is performed on semiconductor die 100 to expose through-vias 230, where a portion of substrate 200 below bottom surfaces of through-vias 230 are removed by grinding. Next, as shown in FIG. 27, redistribution lines (RDLs) 2700 are formed, where RDLs 2700 may be formed of copper, aluminum, nickel, or the like. RDLs 2700 are electrically coupled to through-vias 230 and overlying metal lines 1400. Formation of RDLs 2700 may also adopt the stitching technology as discussed in detail above. The respective step is shown as step 3370 in the process flow illustrated in FIG. 33. In accordance with some embodiments, formation of RDLs 2700 include forming a blanket seed layer (such as a titanium layer and a copper layer on the titanium layer), forming a patterned photoresist (not illustrated), and plating RDLs 2700 in openings in the patterned photoresist. The photoresist may be exposed using double exposure, so that RDLs 2700 may extend, e.g., from active signal region 110A into active signal region 110B (or between any other permuted pair-wise combination of active signal regions 110A, 110B, 110C, 110D).

FIG. 28 representatively illustrates formation of electrical connectors 2800 over passivation layers 2810. Electrical connectors 2800 extend through passivation layers 2810 to connect with RDLs 2700. Electrical connectors 2800 may be solder regions, metal pads, metal pillars, or the like. The respective step is shown as step 3380 in the process flow illustrated in FIG. 33. In accordance with some embodiments, a chip-on-wafer-on-substrate (CoWoS) process is performed. In representative CoWoS process, a plurality of substantially identical device dies (not illustrated) are bonded to metal pillars 2510 in semiconductor die 100, with each of the device dies bonded to one of chips 2820. The processed wafer is then singulated into a plurality of chips 2820, where the singulation is performed on scribe lines 2830, with each of the chips 2820 having a device die bonded thereon. The resulting singulated chips 2820 may them be bonded to packages substrates (not illustrated) to form CoWoS packages.

Figure 29A:
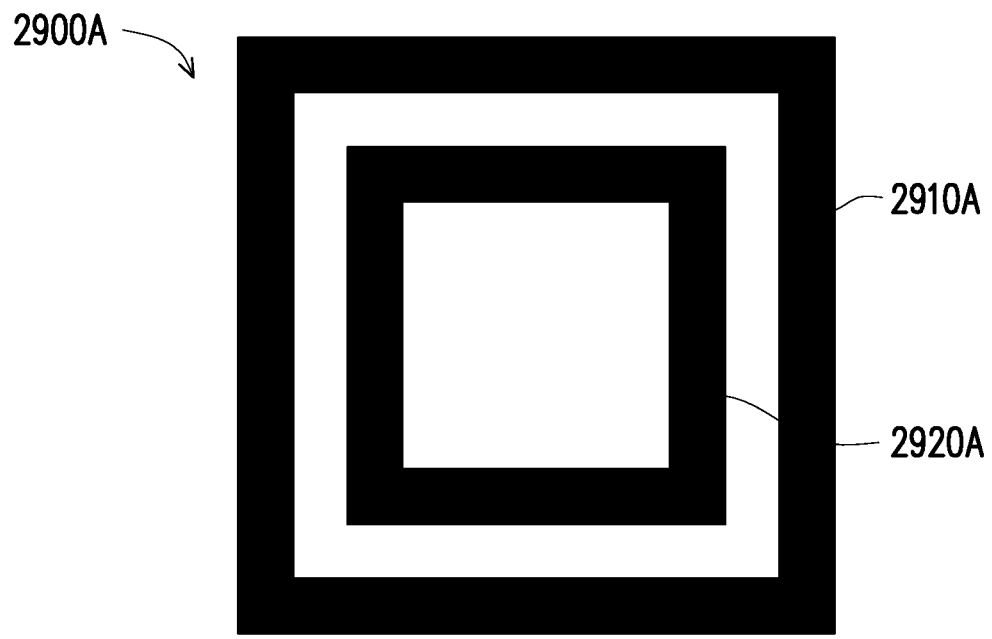
FIGS. 29A, 29B, and 30 representatively illustrate mask overlay alignment marks in accordance with some embodiments.

FIG. 29A representatively illustrates a top view of a composite mask overlay alignment mark 2900A. Composite mask overlay alignment mark 2900A may comprise a first overlay alignment feature 2910A that surrounds a second overlay alignment feature 2920A. In some embodiments, the second overlay alignment feature 2920A may have an interiorly disposed void region (e.g., as representatively illustrated in FIG. 29A). In accordance with some embodiments, first overlay alignment feature 2910A may be formed with a process including lithographic imaging using a first light-exposure through a first lithography mask, and second overlay alignment feature 2920A may be formed with a process including lithographic imaging using a second light-exposure through a second lithography mask, where the second lithography mask is different than the first lithography mask. Accordingly, the first overlay alignment feature 2910A and second overlay alignment feature 2920A may be registered to each other, insofar as the second lithography mask is aligned and registered to features produced from exposure of the first lithography mask. Composite mask overlay alignment mark 2900A may be disposed within a stitching zone (e.g., first overlay stitching zone 110AB, second overlay stitching zone 110AC, third overlay stitching zone 110CD, or fourth overlay stitching zone 110BD). In some embodiments, a plurality of composite mask overlay alignment marks 2900A may be staggered in a regular pattern or irregular pattern across a principal axis of a stitching zone. For purposes herein, a principal axis of a stitching zone may be understood to correspond to a largest or longest linear dimension of the stitching zone. In accordance with representative embodiments, staggering of plural composite mask overlay alignment marks 2900A across a principal axis of a stitching zone may further aide alignment of a subsequent lithographic mask used in processing overlying structure, and registering overlying conductive structure to connect with underlying conductive structure.

Figure 29B:
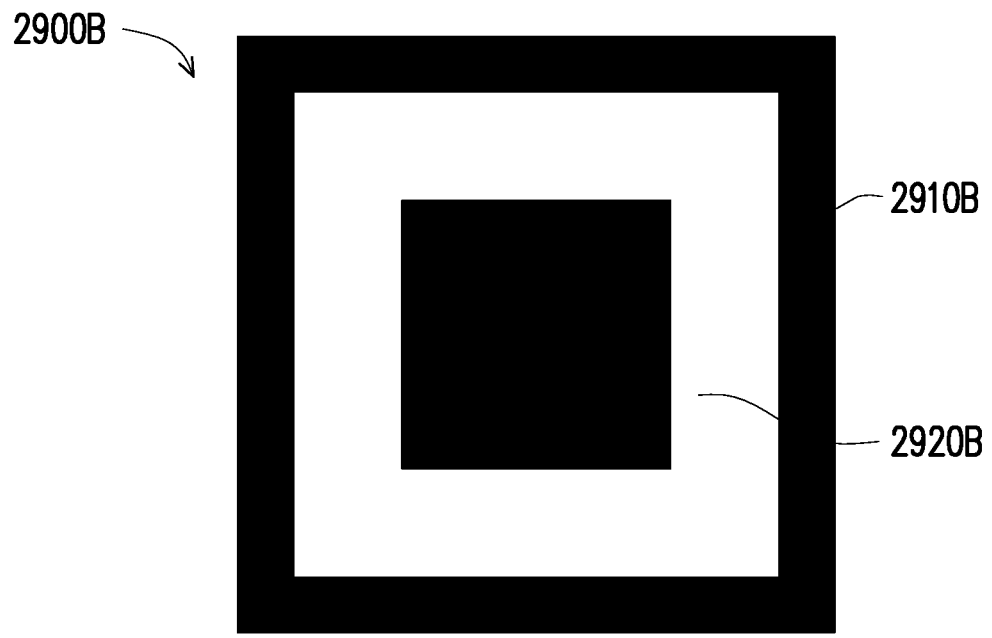

FIG. 29B representatively illustrates a top view of another composite mask overlay alignment mark 2900B. Composite mask overlay alignment mark 2900B may comprise a first overlay alignment mark portion 2910B that surrounds a second overlay alignment mark portion 2920B. In accordance with some embodiments, first overlay alignment mark portion 2910B may be formed with a process employing a first light-exposure through a first lithography mask, and second overlay alignment feature 2920B may be formed with a process employing a second light-exposure through a second lithography mask, where the second lithography mask is different than the first lithography mask. Accordingly, the first overlay alignment mark portion 2920B and second overlay alignment mark portion 2920B may be registered to each other, insofar as the second lithography mask is registered to features produced from exposure of the first lithography mask. Composite mask overlay alignment mark 2900B may be disposed within a stitching zone (e.g., first overlay stitching zone 110AB, second overlay stitching zone 110AC, third overlay stitching zone 110CD, or fourth overlay stitching zone 110BD). In some embodiments, a plurality of composite mask overlay alignment marks 2900B may be staggered in a regular pattern or irregular pattern across a principal axis of a stitching zone. In accordance with representative embodiments, staggering of plural composite mask overlay alignment marks 2900B across a principal axis of a stitching zone may further aide alignment of a subsequent lithographic mask used in processing overlying structure, and registering subsequently produced overlying conductive structure to connect with underlying conductive structure.

Figure 30:
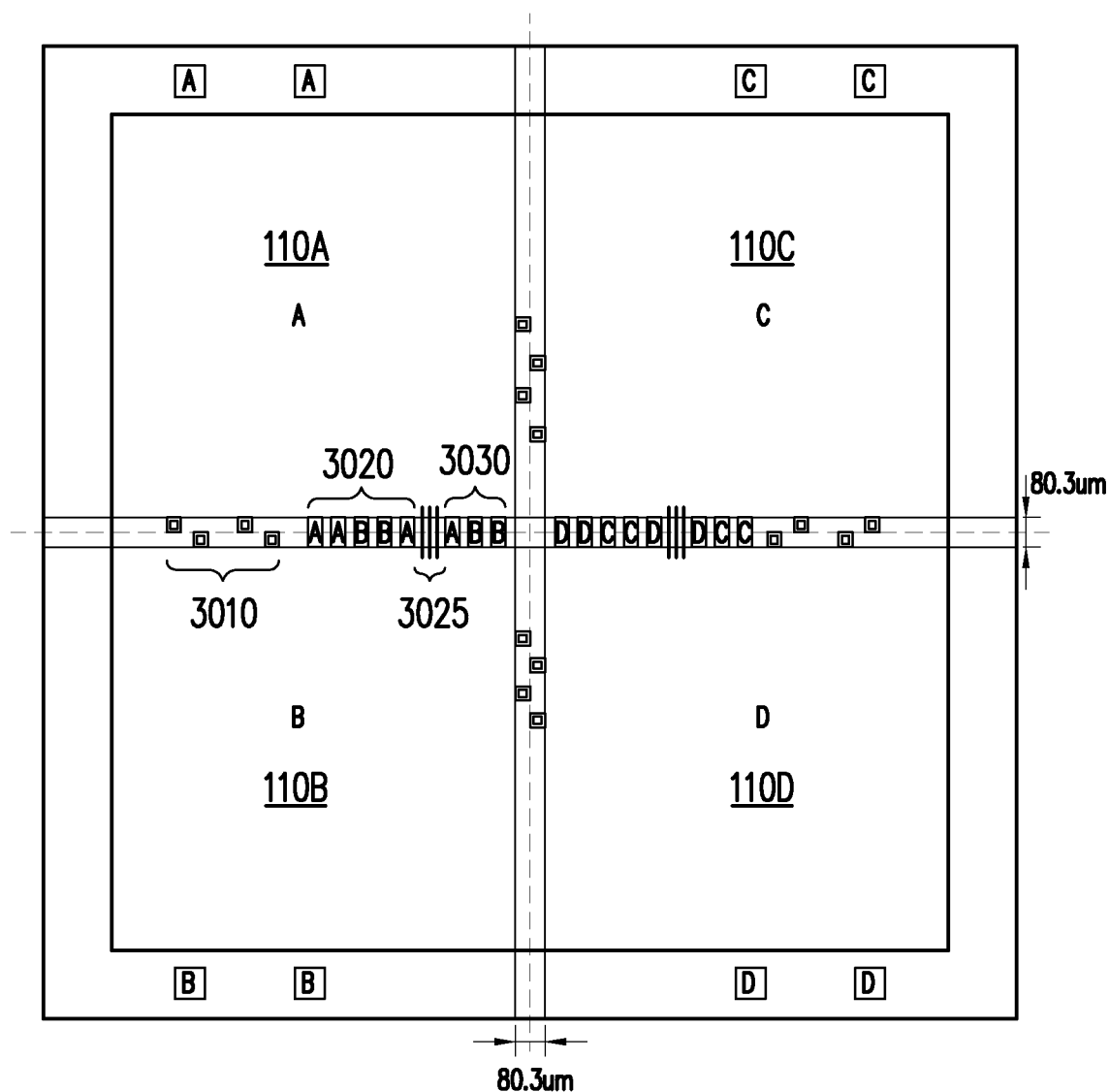

FIG. 30 representatively illustrates a plurality of mask overlay alignment marks 3010, 3020, and 3030 in accordance with some embodiments. Mask overlay alignment marks 3010 may be composite mask overlay alignment marks (such as composite mask overlay alignment mark 2900A or composite mask overlay alignment mark 2900B as described above with respect to FIGS. 29A and 29B) and are arranged in a staggered orientation about a principal axis of a stitching zone disposed between first active signal region 110A and second active signal region 110B. Mask overlay alignment marks 3020 and 3030 schematically illustrate substantially unitary alignment marks with 'A' portions imaged in a first reticle field exposing the first active signal region 110A, and 'B' portions imaged in a second (different) reticle field exposing the second active signal region 110B. Metal lines 3025 extend across the stitching zone disposed between the first active signal region 110A and the second active signal region 110B. In representative implementations, metal lines 3025 connect conductive features between the first active signal region 110A and second active signal region 110B.

In some embodiments, a combination of composite mask overlay alignment marks 2900A and 2900B may be disposed within one or more stitching zones. The stitching zones may be interiorly disposed within a same die, and the combination of composite mask overlay alignment marks 2900A and 2900B may be optionally staggered across a principal axis of a stitching zone within which the combination of marks is disposed. In still other embodiments, a combination (e.g., as representatively illustrated in FIG. 30) of composite mask overlay alignment mark(s) 2900A, composite mask overlay alignment mark(s) 2900B, and/or two or more substantially unitary mask overlay alignment marks produced from separate lithography masks may be alternatively, conjunctively, or sequentially (e.g., as between different damascene process layers) employed.

Figure 31:
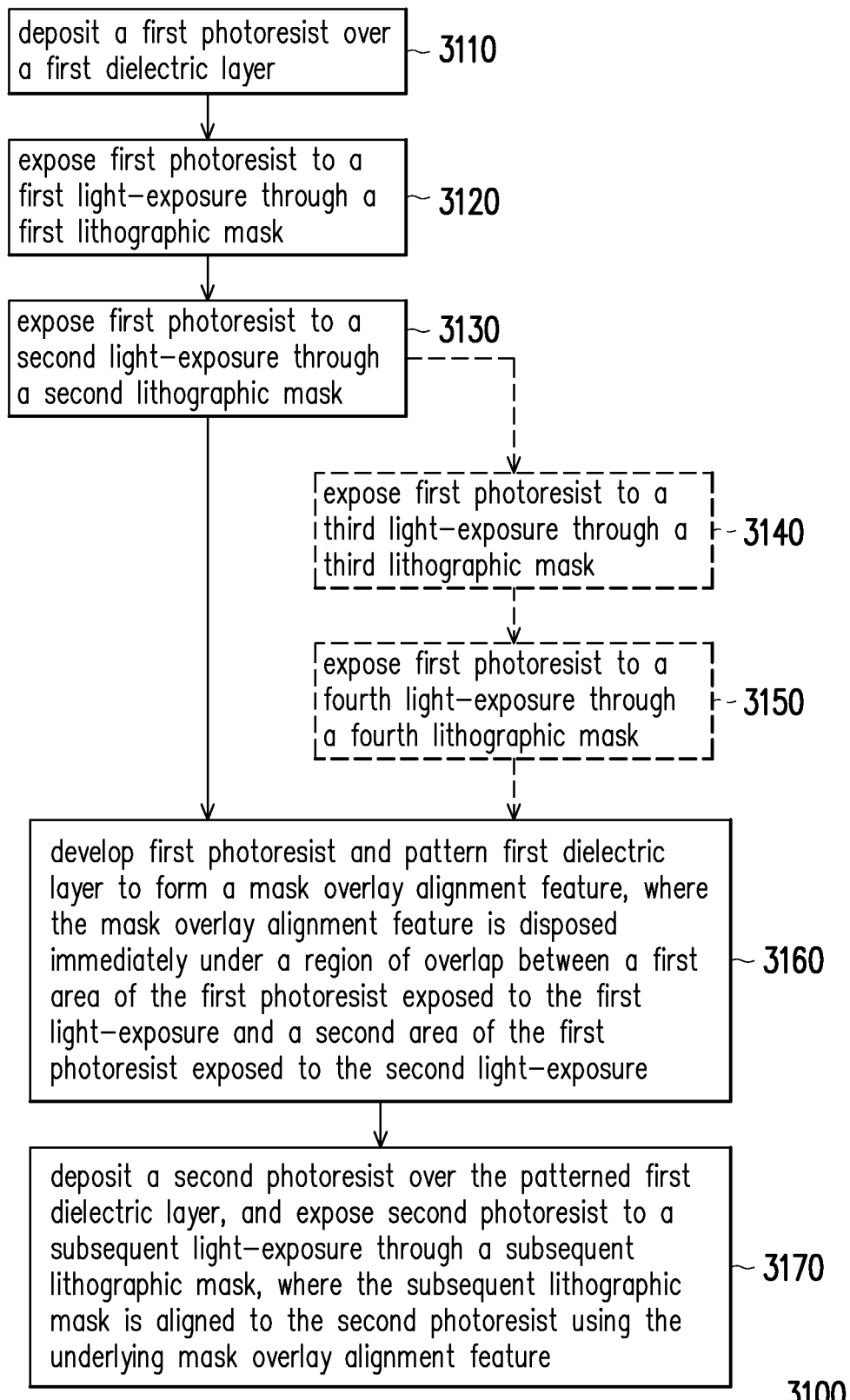
FIGS. 31 through 33 representatively illustrates process flows for forming a large chip using overlay stitching, in accordance with some embodiments.

FIG. 31 representatively illustrates a method 3100 of manufacturing a semiconductor device that includes: a step 3110 of depositing a first photoresist over a first dielectric layer; a step 3120 of exposing the first photoresist to a first light-exposure through a first lithographic mask; a step 3130 of exposing the first photoresist to a second light-exposure through a second lithographic mask; an optional step 3140 of exposing the first photoresist to a third light-exposure through a third lithographic mask; an optional step 3150 of exposing the first photoresist to a fourth exposure through a fourth lithographic mask; a step 3160 of developing the first photoresist and patterning the first dielectric layer to form a mask overlay alignment feature/mark, where the mask overlay alignment feature/mark is disposed immediately under a region of overlap between a first area of the first photoresist exposed to the first light-exposure and a second area of the first photoresist exposed to the second light exposure; and a step 3170 of depositing a second photoresist over the patterned first dielectric layer, and exposing the second photoresist to a subsequent light-exposure through a subsequent lithographic mask, where the subsequent lithographic mask is aligned to the second photoresist using the underlying mask overlay alignment feature.

Figure 32:
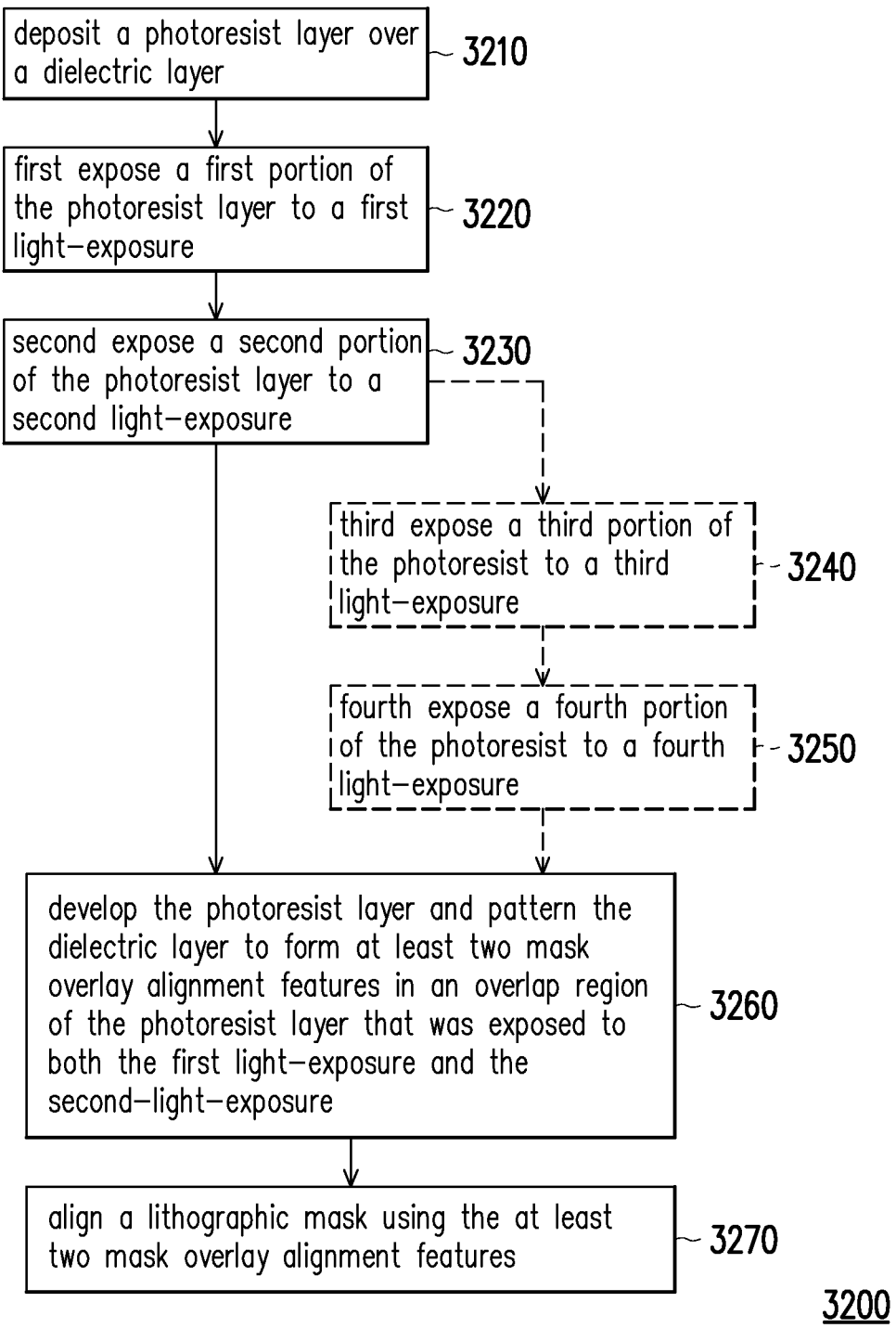

FIG. 32 representatively illustrates a method 3200 of manufacturing a semiconductor device that includes: a step 3210 of depositing a photoresist layer over a dielectric layer; a step 3220 of first exposing a first portion of the photoresist layer to a first light-exposure; a step 3230 of second exposing a second portion of the photoresist layer to a second light-exposure; an optional step 3240 of third exposing a third portion of the photoresist layer to a third light-exposure; an optional step 3250 of fourth exposing a fourth portion of the photoresist layer to a fourth light-exposure; a step 3260 of developing the photoresist layer and patterning the dielectric layer to form at least two mask overlay alignment features/marks in an overlap region of the photoresist layer that was exposed to both the first light-exposure and the second light-exposure; and a step 3270 of aligning a lithographic mask using the at least two mask overlay alignment features/marks.

FIG. 33 representatively illustrates a method 3300 of manufacturing a semiconductor devices that includes: a step 3305 of depositing a dielectric layer, and depositing a photoresist layer over the dielectric layer; a step 3310 of exposing a first active signal region of photoresist to a first light-exposure using a first lithographic mask aligned with a first underlying alignment mark; a step 3315 of exposing a second active signal region of photoresist to a second light-exposure using a second lithographic mask aligned with a second underlying alignment mark; a step 3320 of exposing a third active signal region of photoresist to a third light-exposure using a third lithographic mask aligned with a third underlying alignment mark; a step 3325 of exposing a fourth active signal region of photoresist to a fourth light-exposure using a fourth lithographic mask aligned with a fourth underlying alignment mark; a step 3330 of developing the photoresist; a step 335 of using the developed photoresist as a mask to etch the dielectric layer to form trenches; a step 3340 of filling the trenches with conductive material to form a conductive feature and an alignment mark in an overlap area of overlapping active signal regions; optional step(s) 3350 of looping steps 3305 through 3340; a step 3360 of forming passivation, metal pads, and metal pillars; a step 3370 of forming a backside RDL using stitching; a step 3380 of forming electrical connectors; and a step 3390 of singulating dies.

Figure 34:
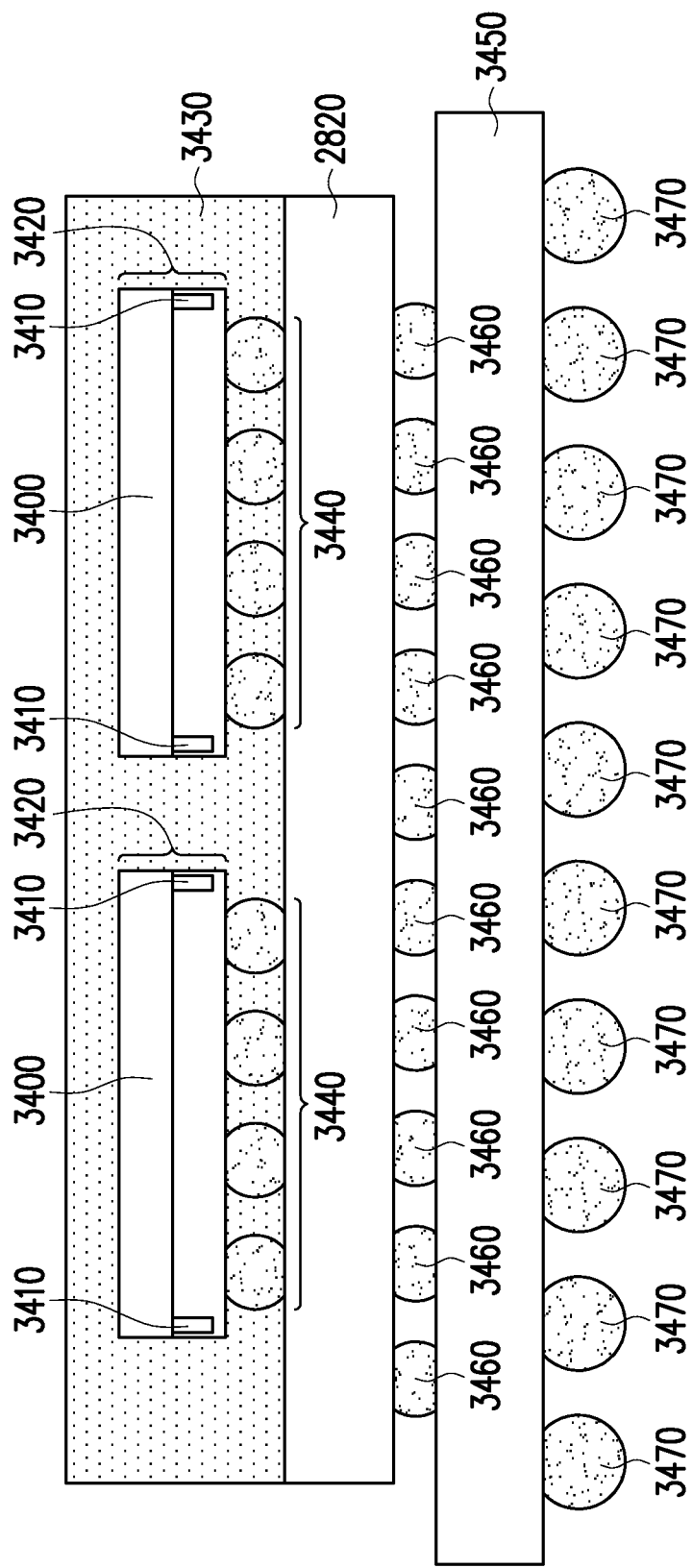
FIG. 34 representatively illustrates a cross sectional view of a chip-on-wafer-on-substrate (CoWoS) structure in accordance with some embodiments.

FIG. 34 representatively illustrates a cross sectional view of a CoWoS structure in accordance with some embodiments, which includes dies 3420 bonded to die 2820 through flip-chip bonding. Dies 3420 may be device dies including active devices (such as transistors, diodes, or the like). Die 2820 may be an interposer with no active devices therein. Device dies 3420 include semiconductor substrates 3400 and optional seal rings 3410. In accordance with some embodiments, die 2820 is formed using the stitching methods described in detail above, and hence includes stitching zones (e.g., 110AB, 110AC, 110CD, 110BD) as shown, e.g., in FIG. 12. In accordance with some embodiments, device dies 3420 may not be formed using stitching, and may be encapsulated in encapsulating material 3430, which may be a molding compound or a molding underfill. Interposer 2820 is further formed on package substrate 3450, which may be a laminate substrate or a built-up substrate. Solder regions 3440, 3460, and 3470 are used for bonding.

Embodiments of the present disclosure provide representative advantages. For example, with stitching, conductive features defined by two or more lithography masks are stitched together, and hence the resulting chip may have a greater area than the maximum size defined by a single reticle field. Additionally, mask overlay marks or alignment features disposed inside overlay stitching zones interposed between adjacent active signal regions that are imaged with different lithography masks may be used to avoid (or otherwise improve) excessive or otherwise out-of-specification errors (e.g., shifting, slanting, or the like) associated with misalignment of lithography masks.

In accordance with some embodiments, a method of manufacturing a semiconductor device includes steps of: depositing a first dielectric layer over a substrate; depositing a first photoresist over the first dielectric layer; exposing the first photoresist to a first light-exposure through a first lithographic mask; and after exposing the first photoresist to the first light-exposure, exposing the first photoresist to a second light-exposure through a second lithographic mask, wherein: a first overlap region of the first photoresist is exposed to both the first light-exposure and the second light-exposure; the first overlap region is interposed between a first active signal region and a second active signal region; the first active signal region and the second active signal region are disposed in a same die; the first light-exposure is used to image the first active signal region; and the second light-exposure is used to image the second active signal region. The method further includes steps of, after the exposing the first photoresist to the second light-exposure, developing the first photoresist and patterning the first dielectric layer to form a first mask overlay alignment feature/mark, where the first mask overlay alignment feature/mark is disposed in the first overlap region. Patterning the first dielectric layer further includes forming an active signal conductive line, where the first light-exposure is used to image a first portion of the active signal conductive line, and the second light-exposure is used to image a second portion of the active signal conductive line. The method further includes steps of: after the patterning the first dielectric layer, depositing a second dielectric layer over the active signal conductive line; depositing a second photoresist over the second dielectric layer; using the first mask overlay alignment feature to align a third lithographic mask over the second photoresist; and after the aligning the third lithographic mask, exposing the second photoresist to a third light-exposure. The method further includes steps of, after the exposing the second photoresist to the third light-exposure, developing the second photoresist and patterning the second dielectric layer to form a second mask overlay alignment feature, where the second mask overlay alignment feature is in the first overlap region. The method further includes steps of, after the exposing the first photoresist to the second light-exposure and before developing the first photoresist, exposing the first photoresist to a third light-exposure through a third lithographic mask, where: a second overlap region of the first photoresist is exposed to both the first light-exposure and the third light-exposure; the third light-exposure is different than the second light-exposure; the developing the first photoresist and the patterning the first dielectric layer forms a second mask overlay alignment feature in the second overlap region; and the second overlap region is different than the first overlap region. The method further includes steps of: after the patterning the first dielectric layer, depositing a second dielectric layer over remaining portions of the first dielectric layer; depositing a second photoresist over the second dielectric layer; after the depositing the second photoresist, aligning a fourth lithographic mask using at least one of the first mask overlay alignment feature or the second mask overlay alignment feature; and after the aligning the fourth lithographic mask, exposing the second photoresist to a fourth light exposure.

In accordance with some embodiments, a method of manufacturing a semiconductor device includes steps of: depositing a photoresist layer over a dielectric layer; first exposing the photoresist layer to a first light-exposure; after the first exposing, second exposing the photoresist layer to a second light-exposure, where a first overlap region of the photoresist layer is exposed to both the first light-exposure and the second light-exposure; and after the second exposing, patterning the dielectric layer to form a first mask overlay alignment feature in the first overlap region. Patterning the dielectric layer forms a second mask overlay alignment feature in the first overlap region. In an embodiment, patterning the dielectric layer forms the second mask overlay alignment feature surrounding the first mask overlay alignment feature. In another embodiment, patterning the dielectric layer forms a first conductive line interposed between the first mask overlay alignment feature and the second mask overlay alignment feature. The method further includes steps of: after the second exposing and before patterning the dielectric layer, third exposing the photoresist layer to a third light-exposure, where a second overlap region of the photoresist layer is exposed to both the first light-exposure and the third light-exposure. In some embodiments, patterning the dielectric layer forms a third mask overlay alignment feature and a second conductive line in the second overlap region.

In accordance with some embodiments, a semiconductor device includes a singulated die having: a substrate; a first active signal region; a first conductive feature over the substrate in the first active signal region; a second active signal region; a second conductive feature over the substrate in the second active signal region; a first alignment region interposed between the first active signal region and the second active signal region; and a first alignment feature over the substrate in the first alignment region. The semiconductor device further includes a second alignment feature in the first alignment region, where the second alignment feature is at a same level as the first alignment feature. In some embodiments, the second alignment feature is surrounded by the first alignment feature. The semiconductor device further includes a first conductive line electrically coupling the first conductive feature to the second conductive feature, where a portion of the first conductive line in the first alignment region is interposed between the first alignment feature and the second alignment feature. The semiconductor device further includes the singulated die further having: a third active signal region, the third active signal region different than the second active signal region; a third conductive feature over the substrate in the third active signal region; a fourth conductive feature over the substrate in the first active signal region, the fourth conductive feature different than the first conductive feature; a second alignment region interposed between the first active signal region and the third active signal region; and a third alignment feature over the substrate in the second alignment region. The semiconductor device further includes a fourth alignment feature over the substrate in the second alignment region. The semiconductor device further includes a second conductive line electrically coupling the third conductive feature to the fourth conductive feature, where a portion of the second conductive line in the second alignment region is interposed between the third alignment feature and the fourth alignment feature. In some embodiments, the second conductive line is substantially orthogonal to the first conductive line.

The foregoing outlines features of several embodiments so that those skilled in the art may better understand aspects of the present disclosure. Those skilled in the art will appreciate that they may readily use the present disclosure as a basis for designing or modifying other processes or structures for carrying out the same or similar purposes, or achieving the same or similar advantages, of embodiments disclosed herein. Those skilled in the art will also appreciate that such equivalent constructions do not depart from the spirit and scope of the present disclosure, and that various changes, substitutions, or alterations may be made without departing from the spirit and scope of the present disclosure.

What is claimed is:

1. A semiconductor device comprising:
   a singulated semiconductor die comprising a semiconductor substrate, wherein the semiconductor substrate is formed of a semiconductor material;
   a first active signal region within the singulated semiconductor die and over the semiconductor substrate;
   a second active signal region within the singulated semiconductor die and over the semiconductor substrate;
   a transition region within the singulated semiconductor die between the first active signal region and the second active signal region;
   a first alignment mark located within the transition region;
   a second alignment mark located within the transition region, the first alignment mark and the second alignment mark being at a same level;
   a third alignment mark located adjacent to the first active signal region opposite the transition region; and
   conductive routing extending within the singulated semiconductor die through the transition region and electrically connecting the first active signal region to the second active signal region, wherein the conductive routing has a single first width across the transition region from the first active signal region to the second active signal region, wherein the first width is larger than a second width within the first active signal region.

2. The semiconductor device of claim 1, wherein the first alignment mark comprises a first portion and a second portion surrounding the first portion.

3. The semiconductor device of claim 1, wherein the semiconductor device has a length of at least 26 mm.

4. The semiconductor device of claim 1, wherein the second alignment mark and the first alignment mark are aligned with each other.

5. The semiconductor device of claim 1, wherein the second alignment mark and the first alignment mark are misaligned with each other.

6. The semiconductor device of claim 1, wherein the first alignment mark is a square alignment mark.

7. A semiconductor device comprising:
   a first alignment mark located over a semiconductor substrate;
   a conductive line adjacent to the first alignment mark, the conductive line connecting a first active signal region with a second active signal region, the second active signal region being on an opposite side of the first alignment mark from the first active signal region, the conductive line comprising a first portion and a second portion shifted but parallel from the first portion, wherein the first portion and the second portion are continuous with each other; and
   a second alignment mark on an opposite side of the conductive line from the first alignment mark, the second alignment mark misaligned with the first alignment mark, wherein the first alignment mark is a same size as the second alignment mark, wherein the first alignment mark, the conductive line, the second alignment mark and the semiconductor substrate are all part of a singulated die, and wherein the semiconductor substrate comprises silicon.

8. The semiconductor device of claim 7, wherein the first alignment mark further comprises:
   a first alignment feature; and
   a second alignment feature surrounding the first alignment feature.

9. The semiconductor device of claim 8, wherein the first alignment feature has a square shape.

10. A semiconductor device comprising:
a singulated die comprising:
- a substrate;
- a first active signal region;
- a first conductive feature over the substrate in the first active signal region;
- a second active signal region;
- a second conductive feature over the substrate in the second active signal region;
- a first alignment region interposed between the first active signal region and the second active signal region, wherein the first conductive feature and the second conductive feature extend from a first side of the first alignment region to a second side of the first alignment region, wherein the first conductive feature has a constant first width as the first conductive feature extends from the first side of the first alignment region to the second side of the first alignment region, the first width being larger than a second width of the first conductive feature within the first active signal region;
- a plurality of first alignment features staggered in an irregular pattern over the substrate in the first alignment region; and
- a plurality of second alignment features adjacent the first active signal region opposite the first alignment region.

11. The semiconductor device of claim 10, further comprising a third alignment feature in the first alignment region, the third alignment feature at a same level as one of the first alignment features.

12. The semiconductor device of claim 11, wherein the third alignment feature is surrounded by the one of the first alignment features.

13. The semiconductor device of claim 11, further comprising a first conductive line electrically coupling the first conductive feature to the second conductive feature, wherein a portion of the first conductive line in the first alignment region is interposed between one of the first alignment features and the third alignment feature.

14. The semiconductor device of claim 13, further comprising:
- the singulated die further comprising a third active signal region, the third active signal region different than the second active signal region;
- a third conductive feature over the substrate in the third active signal region;
- a fourth conductive feature over the substrate in the first active signal region, the fourth conductive feature different than the first conductive feature;
- a second alignment region interposed between the first active signal region and the third active signal region; and
- a fourth alignment feature over the substrate in the second alignment region.

15. The semiconductor device of claim 14, further comprising a fifth alignment feature over the substrate in the second alignment region.

16. The semiconductor device of claim 15, further comprising a second conductive line electrically coupling the third conductive feature to the fourth conductive feature, wherein a portion of the second conductive line in the second alignment region is interposed between the fourth alignment feature and the fifth alignment feature.

17. The semiconductor device of claim 16, wherein the second conductive line is substantially orthogonal to the first conductive line.

18. The semiconductor device of claim 7, further comprising a third alignment mark adjacent the first active signal region opposite the second active signal region.

19. The semiconductor device of claim 18, wherein the first alignment mark has a first width and the third alignment mark has a second width, the first width being greater than the second width.

20. The semiconductor device of claim 7, wherein a distance between the first active signal region and the second active signal region is 80.3 microns.

* * * * *